US008661662B1

(12) United States Patent
Cok

(10) Patent No.: US 8,661,662 B1
(45) Date of Patent: Mar. 4, 2014

(54) MAKING TRANSPARENT TOUCH-RESPONSIVE DEVICE WITH MICRO-WIRE ELECTRODES

(75) Inventor: Ronald Steven Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 13/571,738

(22) Filed: Aug. 10, 2012

(51) Int. Cl.
*H05K 3/10* (2006.01)

(52) U.S. Cl.
USPC ............. 29/846; 29/829; 29/831; 29/622; 349/12

(58) Field of Classification Search
USPC ............. 29/592.1, 593, 25.41–25.42; 345/173–175; 349/12; 200/600
See application file for complete search history.

(56) References Cited

U.S. PATENT DOCUMENTS

| 3,223,525 | A | | 12/1965 | Jonker et al. |
|---|---|---|---|---|
| 4,550,221 | A | * | 10/1985 | Mabusth ............... 178/18.06 |
| 5,035,489 | A | * | 7/1991 | Iijima et al. ............... 349/76 |
| 6,645,444 | B2 | | 11/2003 | Goldstein |
| 6,812,637 | B2 | | 11/2004 | Cok et al. |
| 7,196,281 | B2 | * | 3/2007 | Cok et al. ............... 200/512 |
| 7,663,607 | B2 | | 2/2010 | Hotelling et al. |
| 8,068,186 | B2 | * | 11/2011 | Aufderheide et al. ........ 349/12 |
| 2006/0057502 | A1 | | 3/2006 | Okada et al. |
| 2010/0026664 | A1 | | 2/2010 | Geaghan |
| 2010/0302201 | A1 | | 12/2010 | Ritter et al. |
| 2011/0007011 | A1 | | 1/2011 | Mozdzyn |
| 2011/0099805 | A1 | | 5/2011 | Lee |
| 2011/0273398 | A1 | * | 11/2011 | Ho et al. ............... 345/174 |
| 2011/0288771 | A1 | | 12/2011 | Kuriki |
| 2011/0291966 | A1 | | 12/2011 | Takao et al. |
| 2012/0031746 | A1 | | 2/2012 | Hwang et al. |
| 2012/0154332 | A1 | * | 6/2012 | Chang et al. ............... 345/174 |
| 2012/0162116 | A1 | | 6/2012 | Philipp |
| 2012/0300140 | A1 | * | 11/2012 | Ningrat et al. ............... 349/12 |

* cited by examiner

*Primary Examiner* — Minh Trinh
(74) *Attorney, Agent, or Firm* — Raymond L. Owens

(57) ABSTRACT

A method of making a touch-responsive capacitive device includes providing a transparent substrate and forming anisotropically conductive first and second electrodes extending in corresponding first and second orthogonal length directions over the substrate. Anisotropically conductive first and second electrodes each with electrically connected micro-wires are formed on opposing sides of the transparent substrate. The anisotropically conductive first and second electrodes extend in corresponding first and second length directions. The first and second micro-wires are formed with substantially parallel straight micro-wires extending substantially in the corresponding first and second length directions and a plurality of angled micro-wires are formed at a non-orthogonal angle to the straight micro-wires and electrically connect the straight micro-wires so that the anisotropically conductive first and second electrodes have a greater electrical conductivity in the corresponding first and second length directions than in another anisotropically conductive electrode direction.

16 Claims, 22 Drawing Sheets

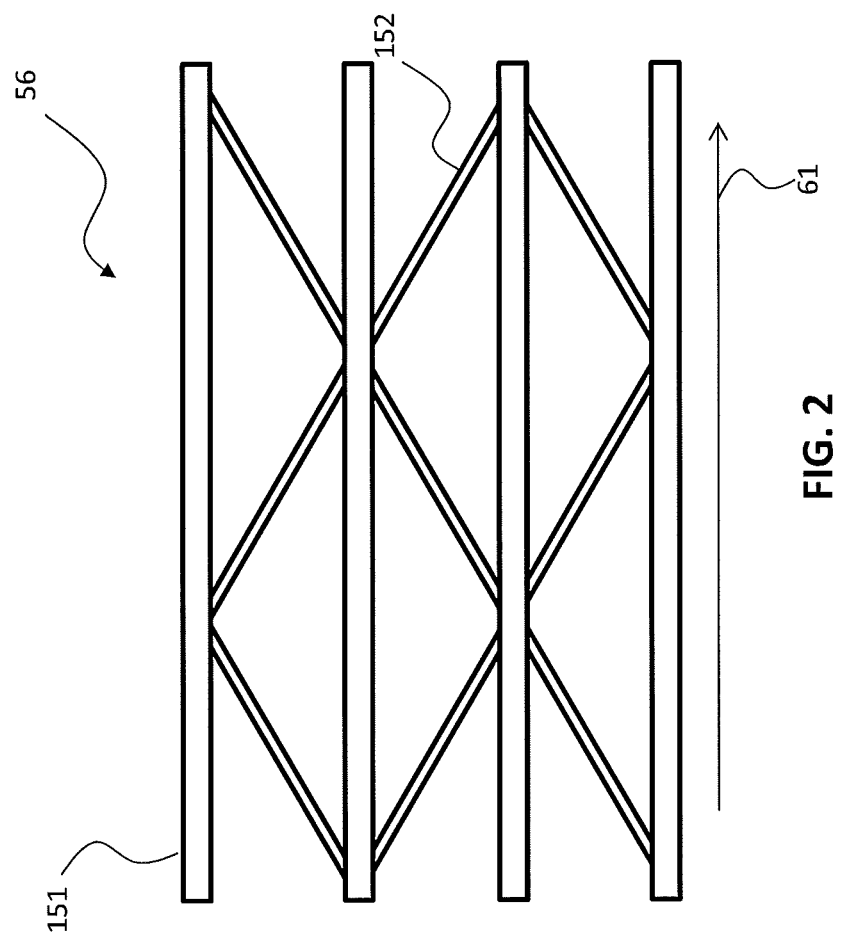

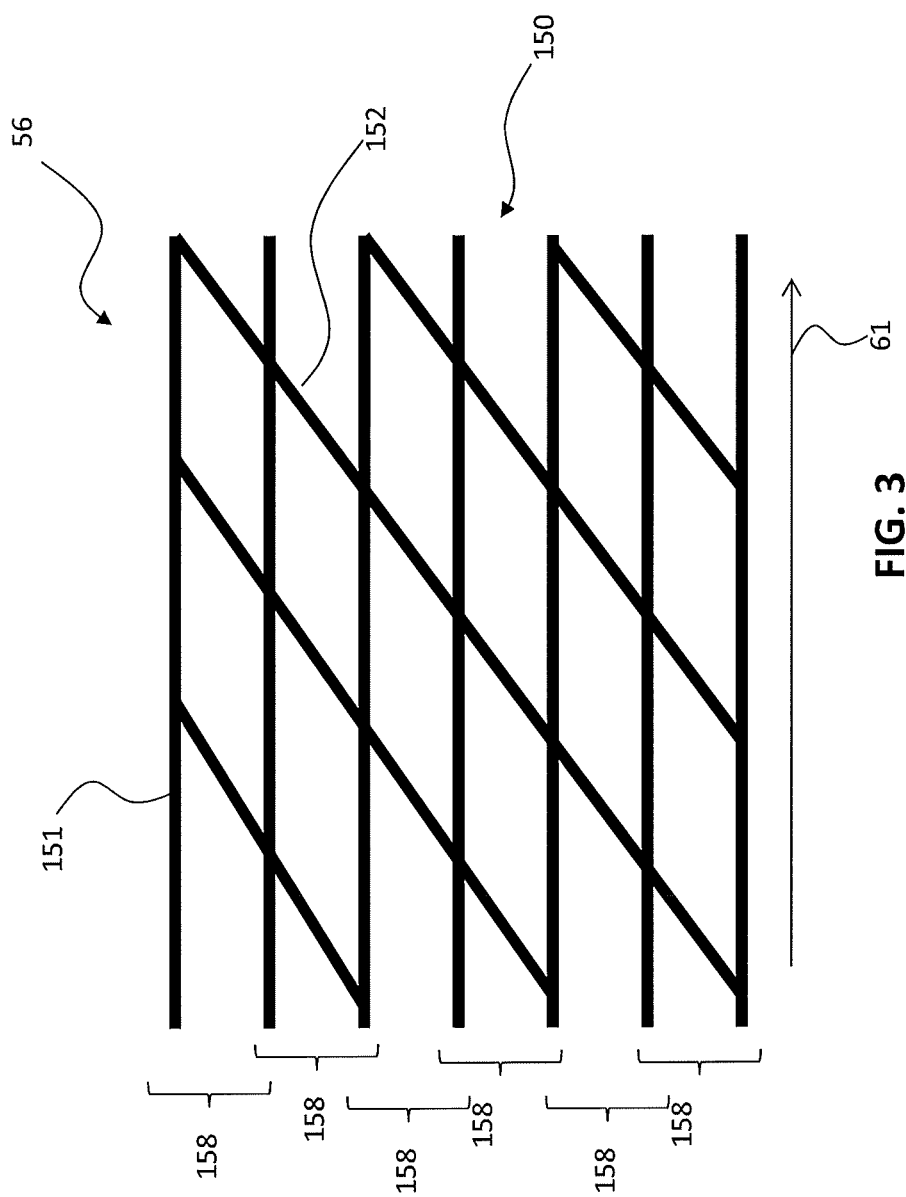

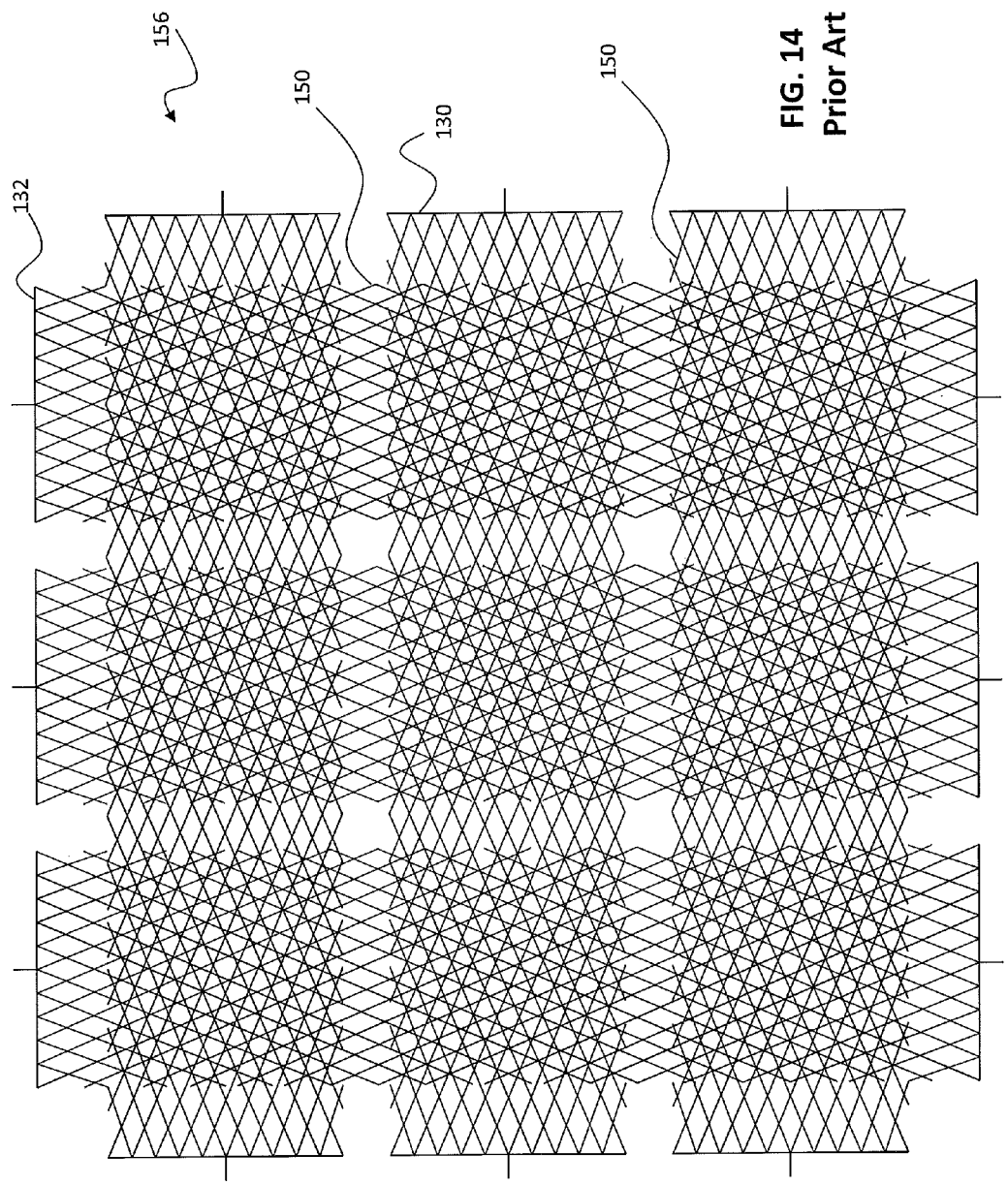

MAKING TRANSPARENT TOUCH-RESPONSIVE DEVICE WITH MICRO-WIRE ELECTRODES

CROSS REFERENCE TO RELATED APPLICATIONS

Reference is made to commonly-assigned U.S. patent application Ser. No. 13/406,649 filed Feb. 28, 2012, entitled "Transparent Touch-Responsive Capacitor With Variable-Pattern Micro-Wires" by Ronald S. Cok; U.S. patent application Ser. No. 13/571,704 filed concurrently herewith, entitled "Micro-Wire Electrode Pattern" by Ronald S. Cok and U.S. patent application Ser. No. 13/571,727 filed concurrently herewith, entitled "Transparent Touch-Screen Capacitor With Micro-Wire Electrodes" by Ronald S. Cok, the disclosures of which are incorporated herein.

FIELD OF THE INVENTION

The present invention relates to micro-wire transparent electrodes and their use in capacitive touch screens.

BACKGROUND OF THE INVENTION

Transparent conductors are widely used in the flat-panel display industry to form electrodes that are used to electrically switch the light-emitting or light-transmitting properties of a display pixel, for example in liquid crystal or organic light-emitting diode displays. Transparent conductive electrodes are also used in touch screens in conjunction with displays. In such applications, the transparency and conductivity of the transparent electrodes are important attributes. In general, it is desired that transparent conductors have a high transparency (for example, greater than 90% in the visible spectrum) and a high electrical conductivity (for example, less than 10 ohms/square).

Touch screens with transparent electrodes are widely used with electronic displays, especially for mobile electronic devices. Such devices typically include a touch screen mounted over an electronic display that displays interactive information. Touch screens mounted over a display device are largely transparent so a user can view displayed information through the touch-screen and readily locate a point on the touch-screen to touch and thereby indicate the information relevant to the touch. By physically touching, or nearly touching, the touch screen in a location associated with particular information, a user can indicate an interest, selection, or desired manipulation of the associated particular information. The touch screen detects the touch and then electronically interacts with a processor to indicate the touch and touch location. The processor can then associate the touch and touch location with displayed information to execute a programmed task associated with the information. For example, graphic elements in a computer-driven graphic user interface are selected or manipulated with a touch screen mounted on a display that displays the graphic user interface.

Touch screens use a variety of technologies, including resistive, inductive, capacitive, acoustic, piezoelectric, and optical technologies. Such technologies and their application in combination with displays to provide interactive control of a processor and software program are well known in the art. Capacitive touch-screens are of at least two different types: self-capacitive and mutual-capacitive. Self-capacitive touch-screens employ an array of transparent electrodes, each of which in combination with a touching device (e.g. a finger or conductive stylus) forms a temporary capacitor whose capacitance is detected. Mutual-capacitive touch-screens can employ an array of transparent electrode pairs that form capacitors whose capacitance is affected by a conductive touching device. In either case, each capacitor in the array is tested to detect a touch and the physical location of the touch-detecting electrode in the touch-screen corresponds to the location of the touch. For example, U.S. Pat. No. 7,663,607 discloses a multipoint touch-screen having a transparent capacitive sensing medium configured to detect multiple touches or near touches that occur at the same time and at distinct locations in the plane of the touch panel and to produce distinct signals representative of the location of the touches on the plane of the touch panel for each of the multiple touches. The disclosure teaches both self- and mutual-capacitive touch-screens.

Referring to FIG. 10, a prior-art display and touch-screen system 100 includes a display 110 with a corresponding touch screen 120 mounted with the display 110 so that information displayed on the display 110 can be viewed through the touch screen 120. Graphic elements displayed on the display 110 are selected, indicated, or manipulated by touching a corresponding location on the touch screen 120. The touch screen 120 includes a first transparent substrate 122 with first transparent electrodes 130 formed in the x dimension on the first transparent substrate 122 and a second transparent substrate 126 with second transparent electrodes 132 formed in the y dimension facing the x-dimension first transparent electrodes 130 on the second transparent substrate 126. A dielectric layer 124 is located between the first and second transparent substrates 122, 126 and first and second transparent electrodes 130, 132. Referring also to the plan view of FIG. 11, in this example first pad areas 128 in the first transparent electrodes 130 are located adjacent to second pad areas 129 in the second transparent electrodes 132. (The first and second pad areas 128, 129 are separated into different parallel planes by the dielectric layer 124.) The first and second transparent electrodes 130, 132 have a variable width and extend in orthogonal directions (for example as shown in U.S. Patent Application Publication Nos. 2011/0289771 and 2011/0099805). When a voltage is applied across the first and second transparent electrodes 130, 132, electric fields are formed between the first pad areas 128 of the x-dimension first transparent electrodes 130 and the second pad areas 129 of the y-dimension second transparent electrodes 132.

A display controller 142 (FIG. 10) connected through electrical buss connections 136 controls the display 110 in cooperation with a touch-screen controller 140. The touch-screen controller 140 is connected through electrical buss connections 136 and wires 134 and controls the touch screen 120. The touch-screen controller 140 detects touches on the touch screen 120 by sequentially electrically energizing and testing the x-dimension first and y-dimension second transparent electrodes 130, 132.

Referring to FIG. 12, in another prior-art embodiment, rectangular first and second transparent electrodes 130, 132 are arranged orthogonally on first and second transparent substrates 122, 126 with intervening dielectric layer 124, forming touch screen 120 which, in combination with the display 110 forms a touch screen and display system 100. First and second pad areas 128, 129 are formed where the first and second transparent electrodes 130, 132 overlap. The touch screen 120 and display 110 are controlled by touch screen and display controllers 140, 142, respectively, through electrical busses 136 and wires 134.

Since touch-screens are largely transparent, any electrically conductive materials located in the transparent portion of the touch-screen either employ transparent conductive materials or employ conductive elements that are too small to be readily resolved by the eye of a touch-screen user. Transparent conductive metal oxides are well known in the display and touch-screen industries and have a number of disadvantages, including limited transparency and conductivity and a tendency to crack under mechanical or environmental stress. Typical prior-art conductive electrode materials include conductive metal oxides such as indium tin oxide (ITO) or very thin layers of metal, for example silver or aluminum or metal alloys including silver or aluminum. These materials are coated, for example, by sputtering or vapor deposition, and are patterned on display or touch-screen substrates, such as glass. However, the current-carrying capacity of such electrodes is limited, thereby limiting the amount of power that can be supplied to the pixel elements. Moreover, the substrate materials are limited by the electrode material deposition process (e.g. sputtering). Thicker layers of metal oxides or metals increase conductivity but reduce the transparency of the electrodes.

Various methods of improving the conductivity of transparent conductors are taught in the prior art. For example, U.S. Pat. No. 6,812,637 describes an auxiliary electrode to improve the conductivity of the transparent electrode and enhance the current distribution. Such auxiliary electrodes are typically provided in areas that do not block light emission, e.g., as part of a black-matrix structure, but are useful only in displays having a reduced fill factor.

It is also known in the prior art to form conductive traces using nano-particles including, for example silver. The synthesis of such metallic nano-crystals is known. For example, U.S. Pat. No. 6,645,444 describes a process for forming metal nano-crystals optionally doped or alloyed with other metals. U.S. Patent Application Publication No. 2006/0057502 entitled "Method of forming a conductive wiring pattern by laser irradiation and a conductive wiring pattern" describes fine wirings made by drying a coated metal dispersion colloid into a metal-suspension film on a substrate, pattern-wise irradiating the metal-suspension film with a laser beam to aggregate metal nano-particles into larger conductive grains, removing non-irradiated metal nano-particles, and forming metallic wiring patterns from the conductive grains. However, such wires are not transparent and thus the number and size of the wires limits the substrate transparency as the overall conductivity of the wires increases.

Touch-screens including very fine patterns of conductive elements, such as metal wires or conductive traces are known. For example, U.S. Patent Application Publication No. 2011/0007011 teaches a capacitive touch screen with a mesh electrode, as does U.S. Patent Application Publication No. 2010/0026664. Referring to FIG. 13, a prior-art x- or y-dimension first or second variable-width transparent electrode 130, 132 includes a micro-pattern 156 of micro-wires 150 arranged in a rectangular grid. The micro-wires 150 are multiple very thin metal conductive traces or wires formed on the first and second transparent substrates 122, 126 (not shown in FIG. 13) to form the x- or y-dimension first or second transparent electrodes 130, 132. The micro-wires 150 are so narrow that they are not readily visible to a human observer, for example 1 to 10 microns wide. The micro-wires 150 are typically opaque and spaced apart, for example by 50 to 500 microns, so that the first or second transparent electrodes 130, 132 appear to be transparent and the micro-wires 150 are not distinguished by an observer.

It is known that micro-wire electrodes in a touch-screen can optically interact with pixels in a display and various layout designs are proposed to avoid such interaction. Thus, the pattern of micro-wires in a transparent electrode is important for optical as well as electrical reasons.

A variety of layout patterns are known for micro-wires used in transparent electrodes. U.S. Patent Application Publication 2010/0302201 teaches that a lack of optical alignment between the rows and columns of the underlying LCD pixels and the overlying diamond-shaped electrodes having edges arranged at 45 degree angles with respect to the underlying rectangular grid of LCD pixels results in a touch-screen largely free from the effects of Moiré patterns or other optical interference effects that might otherwise arise from light reflecting, scattering, refracting or otherwise interacting between the underlying pattern of LCD pixels and the overlying pattern of drive and sense electrodes in undesired or unexpected ways.

U.S. Patent Application Publication No. 2012/0031746 discloses a number of micro-wire electrode patterns, including regular and irregular arrangements. The conductive pattern of micro-wires in a touch screen can be formed by closed figures distributed continuously in an area of 30% or more, preferably 70% or more, and more preferably 90% or more of an overall area of the substrate and can have a shape where a ratio of standard deviation for an average value of areas of the closed figures (a ratio of area distribution) can be 2% or more. As a result, a Moiré phenomenon can be prevented and excellent electric conductivity and optical properties can be satisfied. U.S. Patent Application Publication No. 2012/0162116 discloses a variety of micro-wire patterns configured to reduce or eliminate interference patterns.

U.S. Patent Application Publication No. 2011/0291966 discloses an array of diamond-shaped micro-wire structures. In this disclosure, a first electrode includes a plurality of first conductor lines inclined at a predetermined angle in clockwise and counterclockwise directions with respect to a first direction and provided at a predetermined interval to form a grid-shaped pattern. A second electrode includes a plurality of second conductor lines, inclined at the predetermined angle in clockwise and counterclockwise directions with respect to a second direction, the second direction perpendicular to the first direction and provided at the predetermined interval to form a grid-shaped pattern. This arrangement is used to inhibit Moiré patterns. The electrodes are used in a touch screen device. Referring to FIG. 14, this prior-art design includes micro-wires 150 arranged in a micro-pattern 156 with the micro-wires 150 oriented at an angle to the direction of horizontal first transparent electrodes 130 and vertical second transparent electrodes 132.

Mutual-capacitive touch screens typically include arrays of capacitors whose capacitance is repeatedly tested to detect a touch. In order to detect touches rapidly, highly conductive electrodes are useful. In order to readily view displayed information on a display at a display location through a touch screen, it is useful to have a highly transparent touch screen. There is a need, therefore, for an improved method and device for providing electrodes with increased conductivity and transparency in a mutually capacitive touch-screen device.

SUMMARY OF THE INVENTION

In accordance with the present invention, a method of making a touch-responsive capacitive device, comprises:

providing a plurality of anisotropically conductive first electrodes extending in a first length direction over the transparent substrate, and including forming the anisotropically conductive first electrodes with a plurality of electrically connected micro-wires formed in a first micro-pattern over the first side of the transparent substrate; and providing a plurality of anisotropically conductive second electrodes extending in a second length direction orthogonal to the first length direction under the transparent substrate, and including forming the anisotropically conductive second electrodes with a plurality of electrically connected micro-wires formed in a second micro-pattern under the second side of the transparent substrate; and providing a plurality of anisotropically conductive second electrodes extending in a second length direction orthogonal to the first length direction under the transparent substrate, the anisotropically conductive second electrodes each including a plurality of electrically connected micro-wires formed in a second micro-pattern under the second side of the transparent substrate; and wherein the first and second micro-patterns each have a plurality of substantially parallel straight micro-wires extending substantially in the corresponding first and second length directions and a plurality of angled micro-wires formed at a non-orthogonal angle to the straight micro-wires electrically connecting the straight micro-wires so that the anisotropically conductive first and second electrodes have a greater electrical conductivity in the corresponding first and second length directions than in another anisotropically conductive electrode direction.

The present invention provides a transparent electrode with improved conductivity, transparency, or both conductivity and transparency. The transparent electrode can be used in a variety of electronic devices such as touch screens and integrated with other electronic devices such as displays. The transparent electrode of the present invention is particularly useful in capacitive devices where it can provide increased capacitance and electrical field uniformity.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein:

FIG. 2 is a plan view of an anisotropically conductive electrode illustrating an alternative embodiment of the present invention;

FIG. 3 is a plan view of an anisotropically conductive electrode illustrating another embodiment of the present invention;

FIG. 14 is a schematic illustrating prior-art micro-wires arranged in two arrays of orthogonal transparent electrodes.

DETAILED DESCRIPTION OF THE INVENTION

Figure 1A:
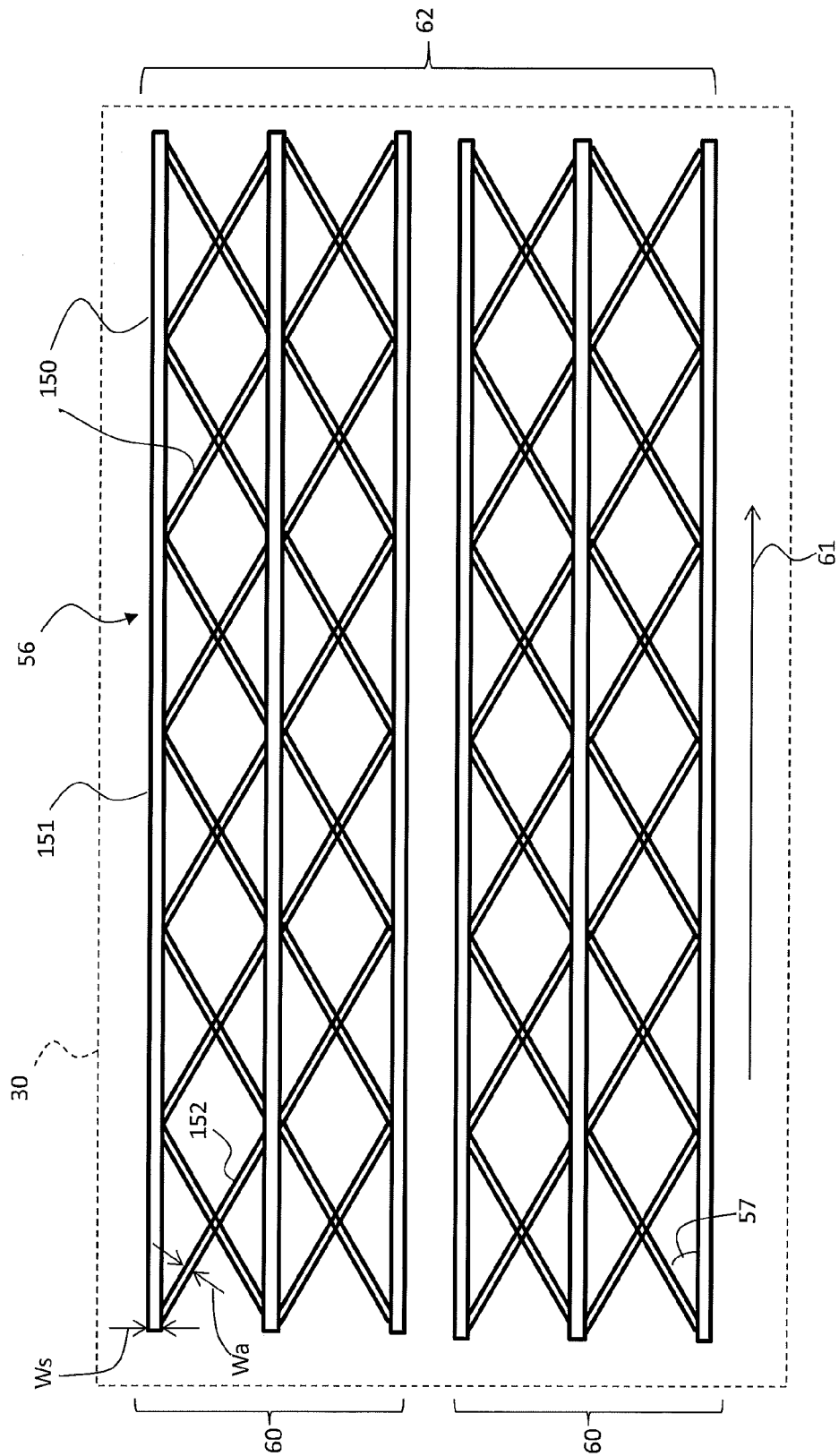
FIG. 1A is a plan view of anisotropically conductive electrodes illustrating an embodiment of the present invention.
Figure 1B:
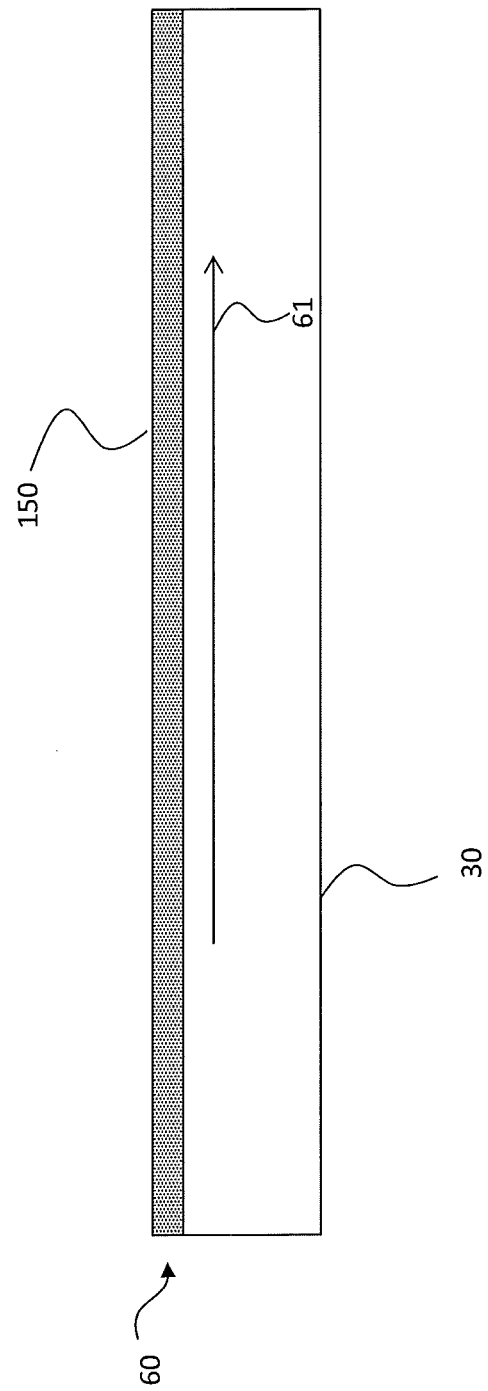
FIG. 1B is a cross section of the embodiment illustrated in FIG. 1A taken in the length direction through a straight micro-wire.

Referring to FIG. 1A, an embodiment of the present invention includes a substrate 30 with anisotropically conductive electrodes 60 that extend in a length direction 61 formed over substrate 30. Anisotropically conductive electrode 60 includes a plurality of electrically connected micro-wires 150 formed in a micro-pattern 56 over substrate 30. Micro-pattern 56 includes a plurality of substantially parallel and straight micro-wires 151 extending substantially in length direction 61 and a plurality of angled micro-wires 152 formed at a non-orthogonal angle 57 to straight micro-wires 151 electrically connect straight micro-wires 151 so that anisotropically conductive electrode 60 has a greater electrical conductivity in length direction 61 than in another electrode conductive direction. Referring to the cross section of FIG. 1B, anisotropically conductive electrode 60 is formed of micro-wires 150 on substrate 30 and extends across substrate 30 in a length direction. The micro-wires 151 are substantially straight and parallel because errors in manufacturing, tolerance limitations, or minor deviations in micro-wire directions are included in the present invention. Patterns of micro-wires form micro-patterns herein, and are distinguished from patterns of electrodes made up by a micro-pattern or micro-wires. An electrode pattern is separate and independent of a micro-wire micro-pattern.

Substrate 30 of the present invention can include any material capable of providing a supporting surface on which micro-wires 150 can be formed and patterned. Substrates such as glass, metal, or plastics can be used and are known in the art together with methods for providing suitable surfaces. In a useful embodiment, substrate 30 is substantially transparent, for example having a transparency of greater than 90%, 80% 70% or 50% in the visible range of electromagnetic radiation.

Micro-wires 150 can be made of metal, for example a thin metal layer composed of highly conductive metals such as gold, silver, copper, or aluminum. Other conductive metals or materials can be used. Micro-wires 150 can be, but need not be, opaque. Micro-wires 150 can be formed by patterned deposition of conductive materials or of patterned precursor materials that are subsequently processed, if necessary, to form a conductive material. Suitable methods and materials are known in the art, for example inkjet deposition or screen printing with conductive inks. Alternatively, micro-wires 150 can be formed by providing a blanket deposition of a conductive or precursor material and patterning and curing, if necessary, the deposited material to form a micro-pattern 156 of micro-wires 150. Photo-lithographic and photographic methods are known to perform such processing. The present invention is not limited by the micro-wire materials or by methods of forming a pattern of micro-wires on a supporting substrate surface. Above referenced commonly-assigned U.S. patent application Ser. No. 13/406,649, discloses a variety of materials and methods for forming patterned micro-wires on a substrate surface.

The anisotropically conductive electrodes 60 can be formed directly on substrate 30 or over substrate 30 on layers formed on substrate 30. The words "on", "over', or the phrase "on or over" indicate that the micro-wires 150 of the anisotropically conductive electrodes of the present invention can be formed directly on the substrate 30, on layers formed on the substrate 30, or on other layers or another substrate 30 located so that the anisotropically conductive electrodes are over the desired substrate 30. Likewise, anisotropically conductive electrodes 60 can be formed under or beneath substrate 30. The words "on", "under", "beneath" or the phrase "on or under" indicate that the micro-wires 150 of the anisotropically conductive electrodes of the present invention can be formed directly on the substrate 30, on layers formed on the substrate 30, or on other layers or another substrate 30 located so that the anisotropically conductive electrodes 60 are under the desired substrate 30. "Over" or "under", as used in the present disclosure, are simply relative terms for layers located on or adjacent to opposing surfaces of a substrate (e.g. 30). By flipping the substrate 30 and related structures over, layers that are over the substrate 30 become under the substrate 30 and layers that are under the substrate 30 become over the substrate 30.

The present invention provides an anisotropically conductive electrode 60. The anisotropically conductive electrode 60 is an electrode that conducts electricity better in one direction (in this case, the length direction 61) than in another conductive direction, for example across the width of anisotropically conductive electrode 60 or than in another conductive direction that is not the length direction. Anisotropically conductive electrode 60 conducts electricity better in the length direction because the conductive path is shorter per linear dimension in the length direction, for example as measured in ohms per centimeter. The conductive path is shorter because of the straight micro-wires 151, or because of the angled micro-wires 152, or both, compared to other arrangements found in the prior art.

The length direction of the anisotropically conductive electrode 60 (e.g. length direction 61) is typically the direction of the greatest spatial extent of anisotropically conductive electrode 60 over the substrate 30 on which the anisotropically conductive electrode 60 is formed. Anisotropically conductive electrodes 60 formed on or over substrates 30 are typically rectangular in shape, or formed of rectangular elements, with a length and a width, and the length is much greater than the width. See, for example, the prior art illustrations of FIG. 12. In any case, the length direction can be selected to be a direction of desired greatest conductance of the anisotropically conductive electrode 60. Anisotropically conductive electrodes 60 are generally used to conduct electricity from a first point on the substrate 30 to a second point and the direction of the anisotropically conductive electrode 60 from the first point to the second point can be the length direction.

Figure 13:
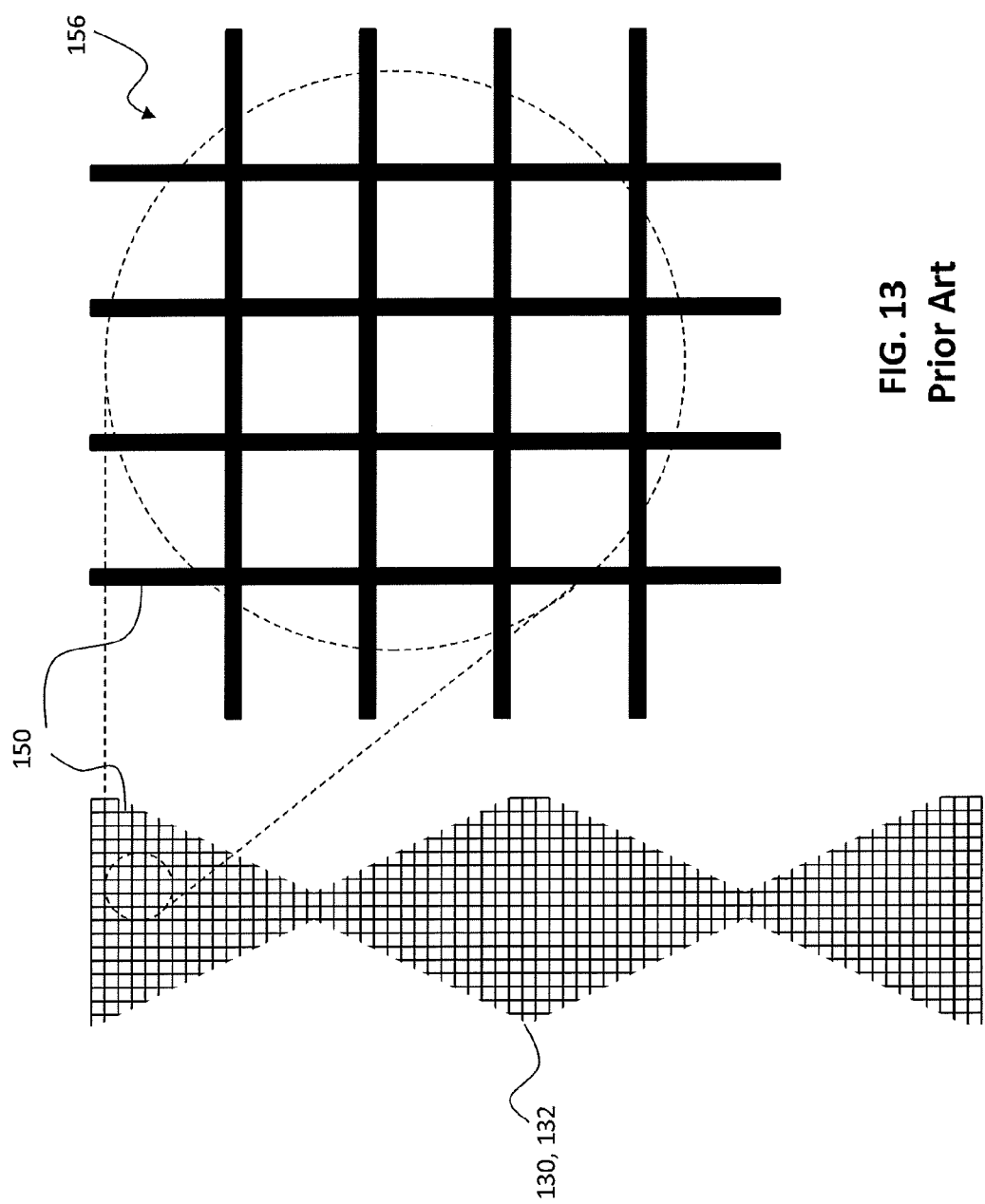
FIG. 13 is a schematic illustrating prior-art micro-wires in an apparently transparent electrode.

In comparing the present invention with prior art arrangements, for example the mesh arrangement of FIG. 13, the angled micro-wires 152 of FIG. 1A will conduct electricity in the desired length direction 61 while the orthogonal micro-wires of FIG. 13 do not. Similarly, in comparing the micro-pattern 156 of FIG. 1A with the micro-pattern of FIG. 14, the straight micro-wires of FIG. 1A provide a shorter conductive path and improved conductivity compared to the angled micro-wires of FIG. 14. Using Ohm's Law, a calculation of the resistance (for equivalent micro-wire conductivity and width) shows a potential improvement of 78% in conductivity and a reduction in transparency of 17% for a combined improvement of approximately 50% so that for a constant transparency, an improvement in conductivity of approximately 50% is obtained (or equivalently a reduction in electrode resistivity of 33%). Alternatively, micro-wires 150 can be made thinner to achieve the same effective conductivity in the preferred length direction with an improved transparency. As illustrated in FIG. 1A, angled micro-wires 152 also provide robust electrical interconnection between straight micro-wires 151 in the presence of micro-wire breaks, for example from use or manufacturing faults.

Figure 8B:
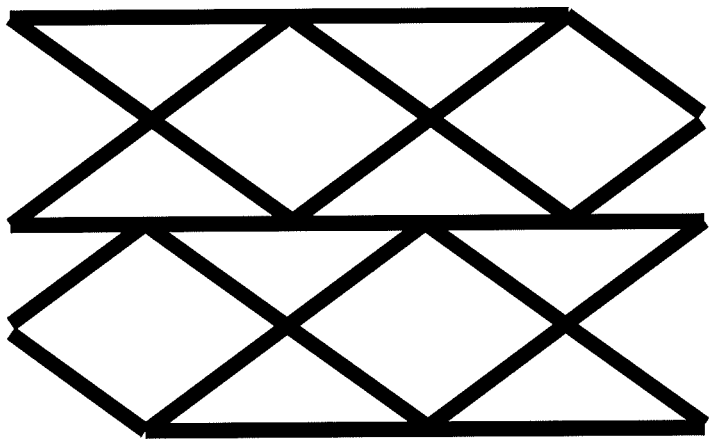
FIGS. 8A-8D are plan views of various anisotropically conductive electrodes illustrating alternative embodiments of the present invention.
Figure 8A:
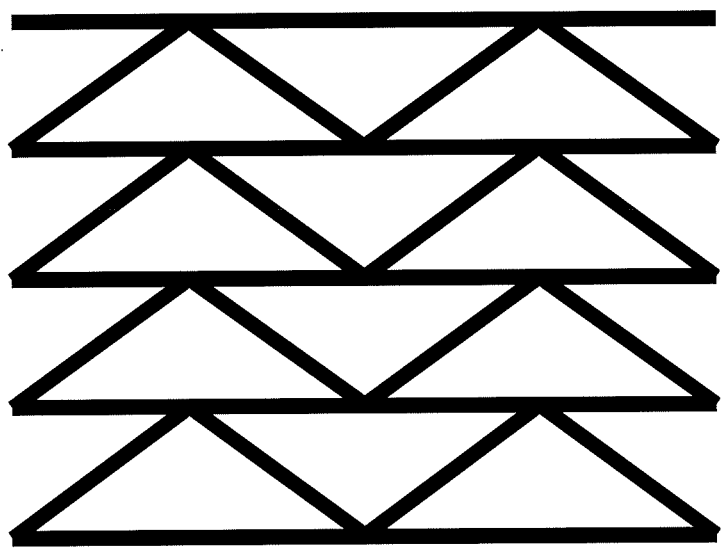
Figure 8D:
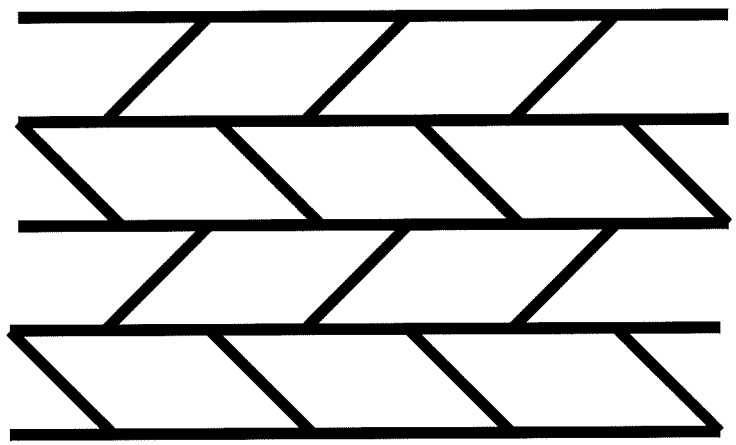
Figure 8C:
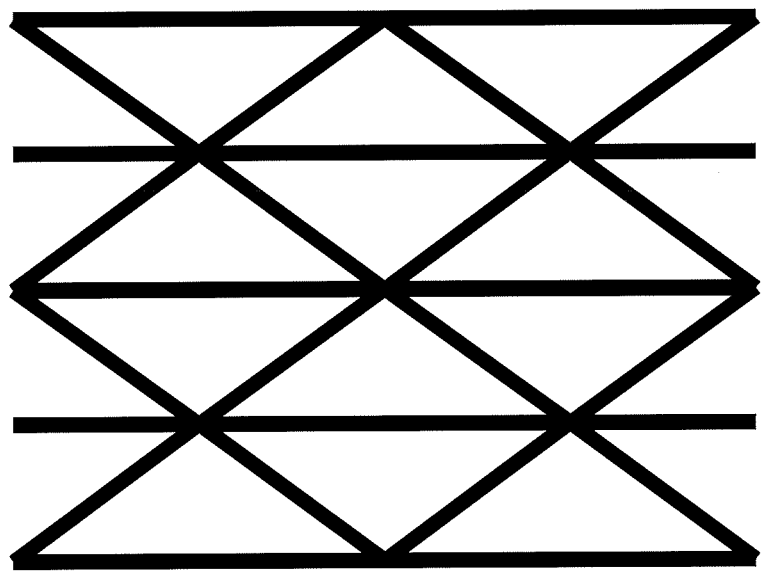

In various embodiments of the present invention, the angled micro-wires 152 are straight line segments, as illustrated in FIG. 1A and can extend across adjacent straight micro-wires 151 as shown in FIGS. 1A, 2, 3, and 8C but not FIGS. 8A, 8B, and 8D. The non-orthogonal angle 57 can be 30 degrees, 45 degrees, or 60 degrees. Angled micro-wires 152 can also be curved (not shown), for example to reduce visibility since the human visual system can be more sensitive to regular, straight lines. Angled micro-wires 152 can have the same width as straight micro-wires 151 or, as illustrated in FIG. 1A, the width Ws of straight micro-wires 151 can be greater than the width Wa of angled micro-wires 152. When straight micro-wires 151 are wider than angled micro-wires 152, conductivity is further improved in the straight micro-wire direction even with the same average micro-wire width. To provide apparent transparency of substrate 30, in an embodiment, micro-wires 150 in anisotropically conductive electrode 60 cover 15% or less of the area of anisotropically conductive electrode 60 and micro-wires 150 can have a width of greater than or equal to 0.5 um and less than or equal to 20 um.

A variety of micro-patterns 156 can be used according to various embodiments of the present invention. As shown in FIG. 1A, angled micro-wires 152 cross each other in the substrate surface area between straight micro-wires 151. In an alternative design shown in FIG. 2, angled micro-wires 152 do not cross each other between straight micro-wires 151 in micro-pattern 56. In either case, or in other cases of the present invention, angled micro-wires 152 can extend across a plurality of straight micro-wires 151.

In yet another embodiment of the present invention, micro-wire pattern 56 can include angled micro-wires 152 formed at a common angle with respect to straight micro-wires 151, as shown in FIG. 3. In this case, angled micro-wires 152 are parallel to each other, as are straight micro-wires 151.

In other embodiments of the present invention, adjacent pairs of straight micro-wires 151 and the angled micro-wires 152 between them form the micro-wire pattern 56 that is replicated for each adjacent pair of straight micro-wires 151. Two adjacent pairs of straight micro-wires 151 have one straight micro-wire 151 in common. For example, as shown in FIG. 3, adjacent pairs 158 of straight micro-wires 151 have the same micro-wire pattern 56, although the pattern is offset between adjacent pairs 158 (180 degrees out of phase in the length direction). In contrast, in the embodiments of FIGS. 1A and 2, the adjacent pairs 158 form micro-wire patterns 56 that are reflections of each other.

Figure 11:
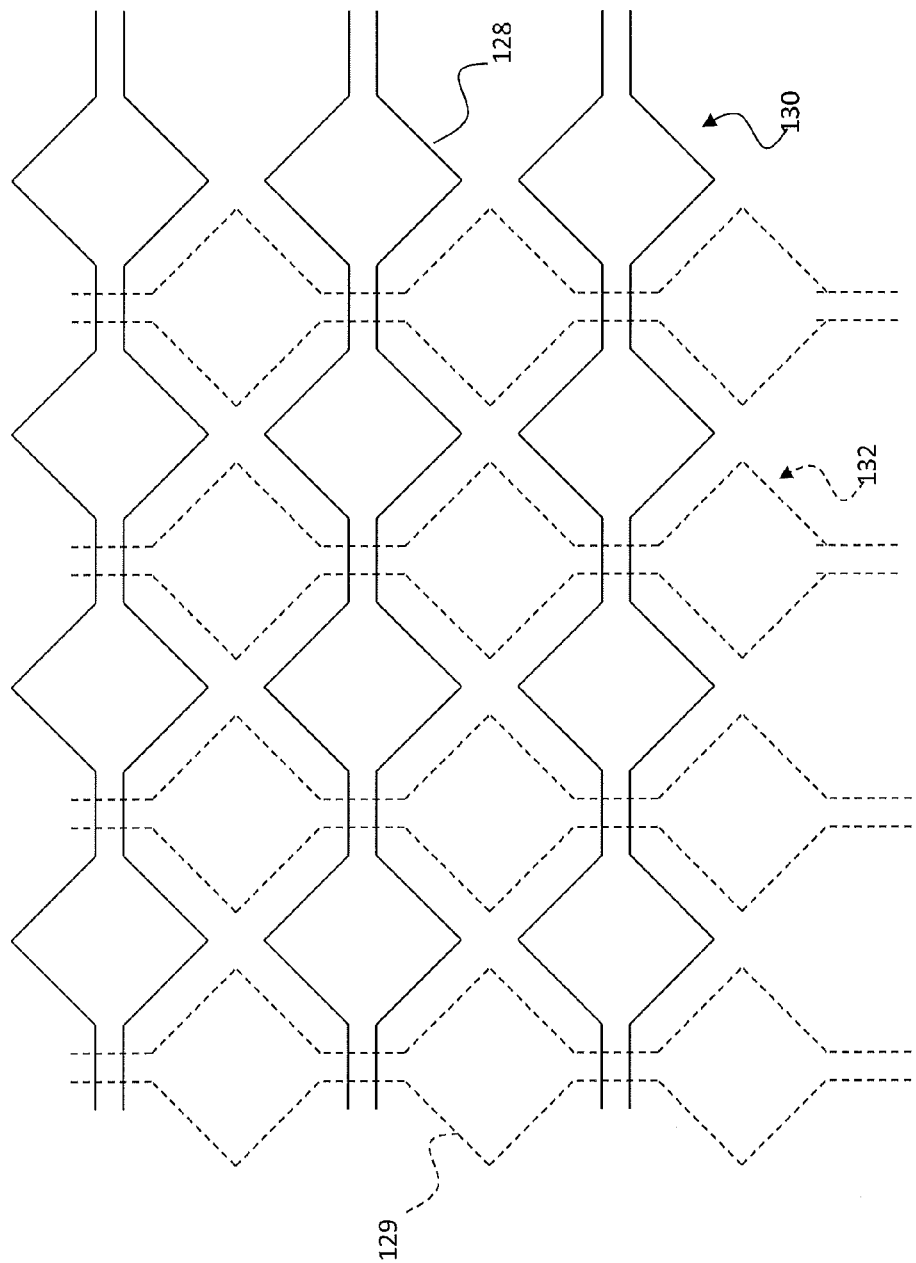
FIG. 11 is a schematic illustrating prior-art pad areas in a capacitive touch screen.

In an embodiment of the present invention, anisotropically conductive electrode 60 is variable in width, where the length of anisotropically conductive electrode 60 is the extent of the anisotropically conductive electrode 60 in the length direction 61 over substrate 30 and the width is in a direction orthogonal to the length (not shown, but illustrated in the prior art with respect to FIG. 13). For variable anisotropically conductive electrodes 60 arranged in an array, the width variations can be spatially aligned so that, for example one anisotropically conductive electrode 60 has its narrowest point where an adjacent anisotropically conductive electrode 60 has its widest point or so that one anisotropically conductive electrode 60 has its narrowest point where an adjacent anisotropically conductive electrode 60 has its narrowest point (as illustrated in the prior art with respect to FIG. 11).

FIGS. 8A-8D illustrates alternative micro-wire micro-patterns 56 of various embodiments of anisotropically conductive electrodes 60 of the present invention having straight and angled micro-wires.

Figure 4A:
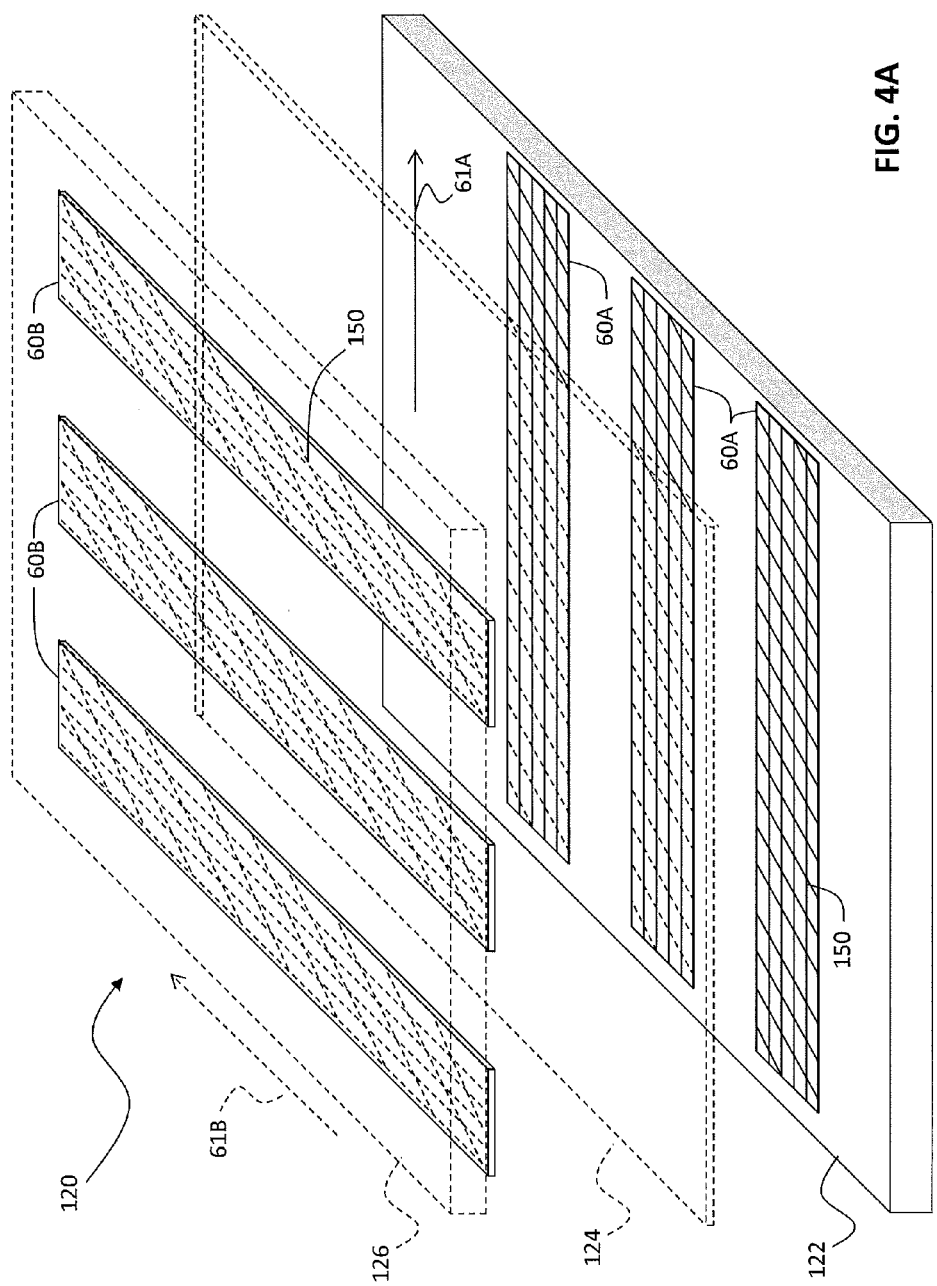
FIG. 4A is a perspective of a touch-screen structure having anisotropically conductive electrodes in an embodiment of the present invention.
Figure 5A:
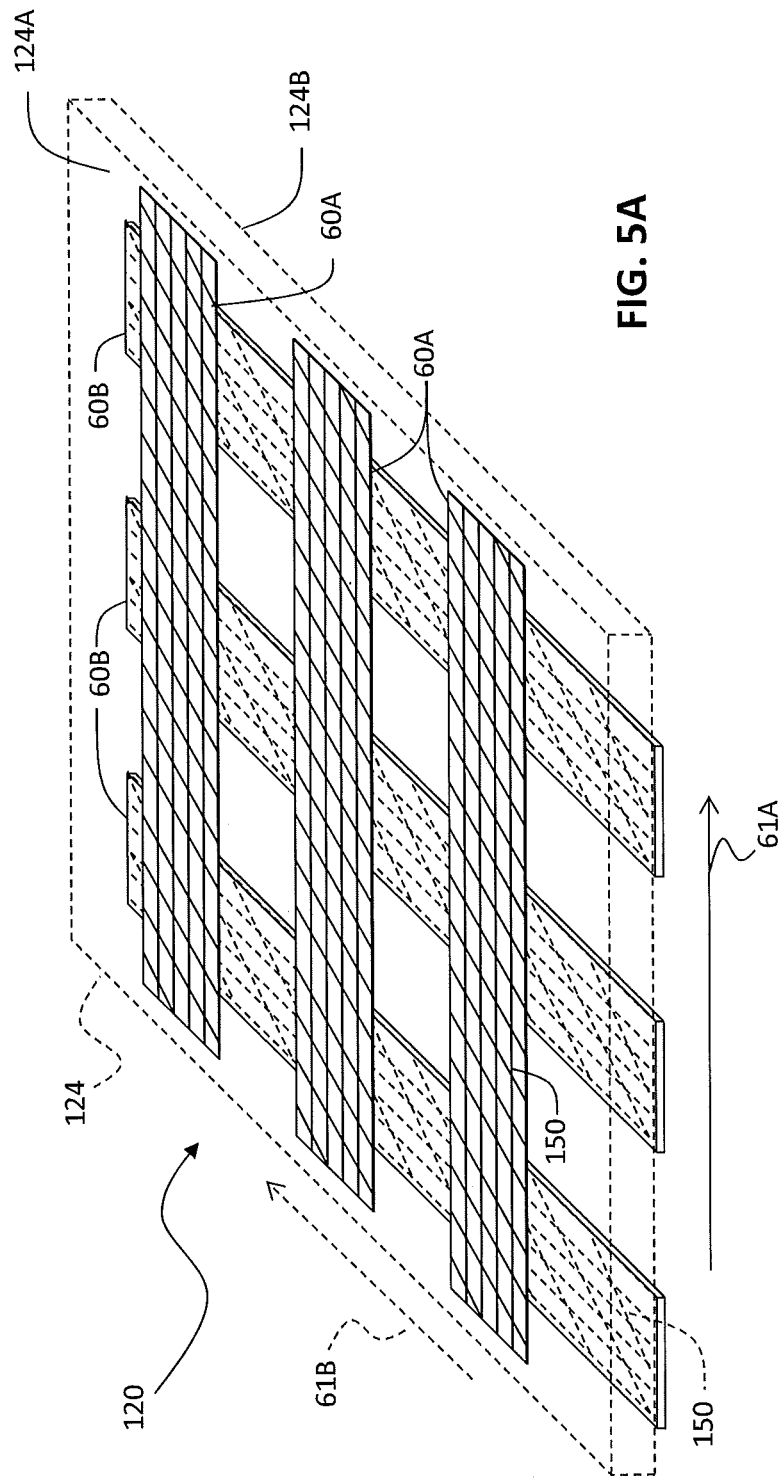
FIG. 5A is a perspective of a touch-screen structure having anisotropically conductive electrodes on opposite sides of a substrate in another embodiment of the present invention.

In a further embodiment of the present invention, an electrode array 62 includes a plurality of anisotropically conductive electrodes 60 formed over substrate 30. FIG. 1A illustrates the electrode array 62 of two anisotropically conductive electrodes 60. FIGS. 4A and 5A illustrate three substantially parallel anisotropically conductive electrodes 60 forming the electrode array 62 on each of two substrate surfaces. Anisotropically conductive electrodes 60 in the electrode array 62 are substantially parallel and regularly distributed over substrate 30.

An anisotropically conductive electrode 60 of the present invention can be used in the touch-screen 120, as illustrated in the perspective of FIG. 4A. Wires 134, buss connections 136, touch-screen controller 140, and display controller 142 of FIG. 10 can be used to control and operate a touch-responsive capacitive device 10 of the present invention, as discussed above with respect to FIG. 10. In response to a voltage differential provided between anisotropically conductive electrodes 60 on either side of dielectric layer 124, an electrical field is formed and a capacitance produced. Touch-screen controller 140 (FIG. 10) sequentially energizes the electrodes and senses a capacitance. The capacitance of overlapping electrode areas (e.g. overlap areas 128, 129) is changed in the presence of a conductive element, such as a finger. The change in capacitance is detected and indicates a touch. By providing an anisotropically conductive electrode 60, one or all of the conductivity, sensitivity, signal-to-noise ratio, and sensing rate of a touch screen can be improved. Alternatively or in addition, the transparency and hence the appearance of the touch screen can be improved.

As shown in FIG. 4A, first anisotropically conductive electrodes 60A including a plurality of electrically connected micro-wires 150 formed in a first micro-pattern extend in a first length direction 61A over a first transparent substrate 122 and under the transparent dielectric layer 124. Second anisotropically conductive electrodes 60B including a plurality of electrically connected micro-wires 150 formed in a second micro-pattern extend in a second length direction 61B under a second transparent substrate 126 over the transparent dielectric layer 124. The first length direction can be substantially perpendicular to the second length direction, as illustrated.

The dielectric layer 124 has a first side and a second side opposite and substantially parallel to the first side. First anisotropically conductive electrodes 60A are separated from second anisotropically conductive electrodes 60B by dielectric layer 124. First length direction 61A is orthogonal to second length direction 61B. First and second anisotropically conductive electrodes 60A, 60B include micro-wires 150 arranged in a micro-pattern corresponding to the micro-wire configuration of FIG. 3.

The first and second micro-patterns each have a plurality of substantially parallel straight micro-wires extending substantially in the corresponding first and second length directions 61A, 61B and a plurality of angled micro-wires formed at a non-orthogonal angle 57 to the straight micro-wires electrically connecting the straight micro-wires so that the anisotropically conductive first and second electrodes 60A, 60B each have a greater electrical conductivity in the corresponding first and second length directions than in another conductive electrode direction.

As discussed further below, first and second anisotropically conductive electrodes 60A, 60B can be formed on transparent substrates 122, 126 separate from dielectric layer 124. Alternatively, first and second anisotropically conductive electrodes 60A, 60B can be formed on dielectric layer 124 without first transparent substrate 122 or second transparent substrate 126, or some combination of dielectric layer 124, first transparent substrate 122, or second transparent substrate 126. The first anisotropically conductive electrodes 60A can be formed directly on transparent substrates 122 or on layers formed on transparent substrate 122. The second anisotropically conductive electrodes 60B can be formed directly on transparent substrate 126 or on layers formed under transparent substrate 126. The first and second transparent substrate 122, 126 can be the same kind of material and can be processed similarly to form the first and second anisotropically conductive electrodes 60A, 60B on a process side of the first and second transparent substrate 122, 126. The transparent substrate 126 with second anisotropically conductive electrodes 60B can simply be a flipped-over version of transparent substrate 122. If separate transparent substrates 122, 126 are used, preferably the first and second anisotropically conductive electrodes 60A, 60B are each located adjacent to the transparent dielectric layer 124.

Figure 4B:
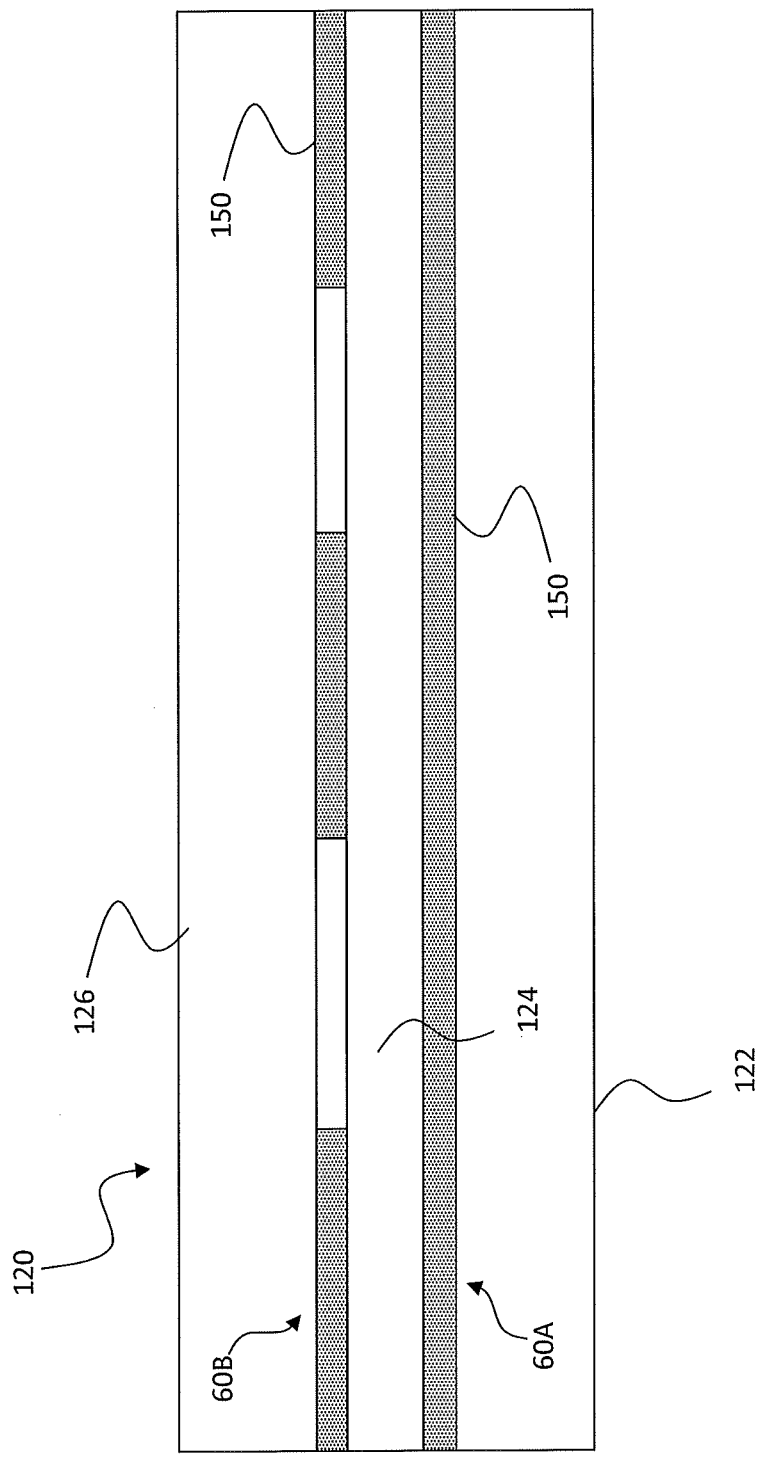
FIG. 4B is a cross section of the embodiment illustrated in FIG. 4A taken in the length direction of the lower substrate through a portion of a straight micro-wire.

Referring to FIG. 4B, a cross-section of the illustration of FIG. 4A includes first transparent substrate 122, first anisotropically conductive electrode 60A, transparent dielectric layer 124, second anisotropically conductive electrode 60B, and second transparent substrate 126.

Figure 5B:
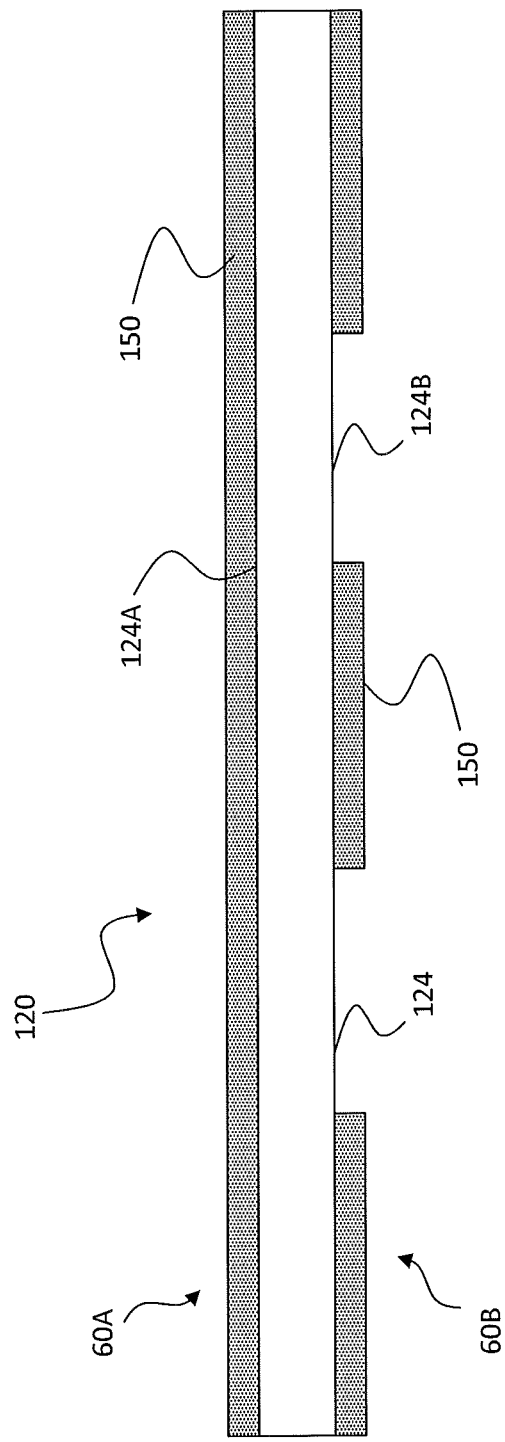
FIG. 5B is a cross section of the embodiment illustrated in FIG. 5A taken in the length direction of the upper substrate surface through a portion of a straight micro-wire.

In an alternative embodiment shown in FIG. 5A, first anisotropically conductive electrode 60A, can be formed on a surface of the transparent dielectric layer 124, for example first surface 124A, or on a layer formed on first surface 124A. Second anisotropically conductive electrode 60B, can be formed on a surface of the transparent dielectric layer 124, for example second surface 124B, or on a layer formed on second surface 24B. For clarity of illustration, the horizontal first anisotropically conductive electrodes 60A are shown on the top, first surface 124A of transparent dielectric layer 124 while vertical second anisotropically conductive electrodes 60B are shown on the bottom, second surface 124B of transparent dielectric layer 124 (opposite from the structure shown in FIG. 4A). Referring to FIG. 5B, a cross-section of the illustration of FIG. 5A includes first anisotropically conductive electrode 60A formed on surface 124A of transparent dielectric layer 124, and second anisotropically conductive electrode 60B formed on surface 124B.

Figure 6:
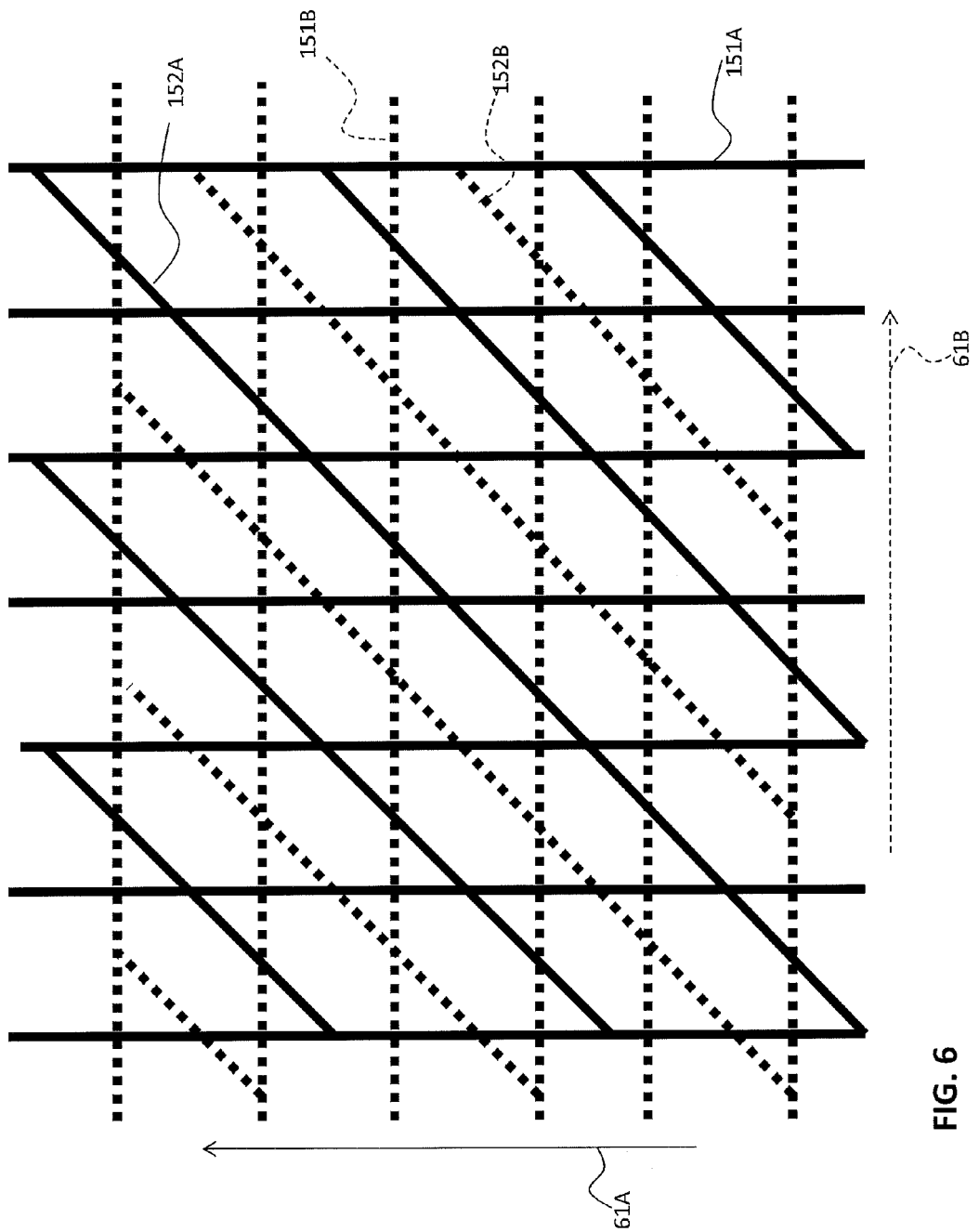
FIG. 6 is a plan view of two aligned layers of anisotropically conductive electrodes illustrating an embodiment of the present invention.

In another embodiment of the present invention, the angled micro-wires 152 on each side of transparent dielectric layer 124 are aligned. Referring to FIG. 6, the micro-wire 150 micro-patterns 56 illustrated in FIG. 3 are formed on opposite sides of the transparent dielectric layer 124 (not shown in FIG. 6 but corresponding to FIG. 5A). In FIG. 6, the first micro-pattern 56 arrangement is shown in solid lines representing straight and angled micro-wires 151A and 152A, respectively, while the second micro-pattern 56 arrangement is shown in dashed lines representing the straight and angled micro-wires 151B and 152B, respectively. The first micro-pattern 56 is a rotated by 90 degrees and mirror image (reflected) version of the second micro-pattern 56.

As shown in FIG. 6, angled micro-wires 152A in the first micro-pattern are substantially parallel to angled micro-wires 152B in the second micro-pattern. In one embodiment, at least one angled micro-wire 152A is substantially parallel to an angled micro-wire 152B. In another embodiment, more than one or all of the angled micro-wires 152A are substantially parallel to angled micro-wires 152B. As shown in FIG. 6, angled micro-wires 152A in the first micro-pattern 56 are spaced apart by the same distance as are angled micro-wires 152B in the second micro-pattern 56. Moreover, angled micro-wires 152A are out of phase with angled micro-wires 152B by 180 degrees. In an alternative arrangement (not shown), angled micro-wires 152A overlap angled micro-wires 152B (a phase difference of zero) or have some other spatial phase difference.

The arrangement of FIG. 6 has several advantages. Because the length directions of the straight micro-wires 151A are orthogonal to the straight wires 151B, orthogonal electrodes (e.g. anisotropically conductive electrodes 60A, 60B of FIGS. 4A, 5A) have an improved conductivity in their respective preferred length direction or in transparency as discussed above. Because the angled micro-wires 152A and 152B are parallel, a stronger electrical field can be obtained between the angled micro-wires 152A, 152B, for a given voltage differential between the micro-wire layers, providing an improved signal-to-noise ratio for detecting changes in capacitance. Furthermore, the electrical field can have improved uniformity.

Figure 9:
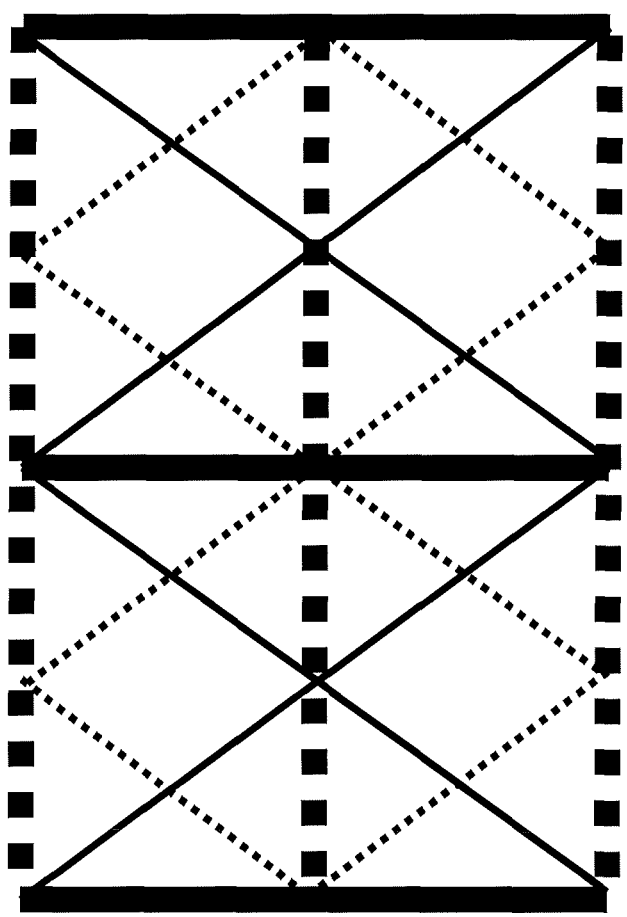
FIG. 9 is a plan view of two aligned layers of anisotropically conductive electrodes illustrating another embodiment of the present invention.

In an alternative arrangement, illustrated in FIG. 9 using dashed lines for one anisotropically conductive electrode 60A, 60B and solid lines for another anisotropically conductive electrode 60A, 60B, angled micro-wires 152A, 152B cross between straight micro-wires 151A, 151B in each layer. The straight micro-wires 151A, 151B in the separate layers are orthogonal and angled micro-wires 152A, 152B in a layer each have a parallel angled micro-wire 152A, 152B in the other layer.

Thus, in an embodiment of the present invention illustrated in FIGS. 5A, 5B, and 6, the touch-screen 120 includes a transparent substrate (e.g. transparent dielectric layer 124) having a substantially planar first side 124A and an opposing substantially parallel substantially planar second side 124B. A plurality of anisotropically conductive first electrodes 60A formed on or over the first side 124A extending in a first length direction 61A are formed over or on first side 124A, first anisotropically conductive electrodes 60A each including a plurality of electrically connected micro-wires 150 formed in the first micro-pattern 56. A plurality of anisotropically conductive second electrodes 60B extending in a second length direction 61B orthogonal to first length direction 61A are formed on or under second side 124B, anisotropically conductive second electrodes 60B each including a plurality of electrically connected micro-wires 150 formed in the second micro-pattern 56.

Anisotropically conductive first electrode 60A includes a plurality of substantially parallel first straight micro-wires 151A extending substantially in first length direction 61A and a plurality of first angled micro-wires 152A formed at a non-orthogonal angle 57 to first straight micro-wires 151A electrically connecting first straight micro-wires 151A. Anisotropically conductive second electrode 60B has a plurality of substantially parallel second straight micro-wires 151B extending substantially in second length direction 61B and a plurality of second angled micro-wires 152B formed at a non-orthogonal angle 57 to second straight micro-wires 151B electrically connecting second straight micro-wires 151B. Anisotropically conductive first and second electrodes 60A, 60B each have a greater electrical conductivity in corresponding first and second length directions 61A, 61B, respectively, than in another conductive electrode direction, for example the width direction of corresponding anisotropically conductive electrodes 60A, 60B.

In an embodiment, angled micro-wires 152A are parallel to angled micro-wires 152B. In another embodiment, angled micro-wires 151A extend across a plurality of straight micro-wires 151A at a common angle with respect to the straight micro-wires 151A and angled micro-wires 152B extend across a plurality of straight micro-wires 151B at the common angle with respect to the straight micro-wires 152B. In an embodiment, first angled micro-wires 152A are substantially centered between second angled micro-wires 152B. In another embodiment, first angled micro-wires 152A overlap second angled micro-wires 152B. The first micro-pattern 56 can be a rotation or a mirror image of the second micro-pattern 56, or both. Angled micro-wires 152B formed at a common angle in anisotropically conductive electrodes 60 separated by dielectric layer 124 can increase the capacitance of overlapping electrode areas and improve the signal-to-noise ratio of sensed capacitance signals.

In a useful embodiment of the present invention, first transparent substrate 122 is a cover or substrate of a display through which light is emitted or reflected by the display. Alternatively, second transparent substrate 126 is a cover or substrate of a display through which light is emitted or reflected by the display. In another embodiment, touch screen 120 is located in combination with a display to form a touch-responsive capacitive device including a touch screen and display.

Figure 7:
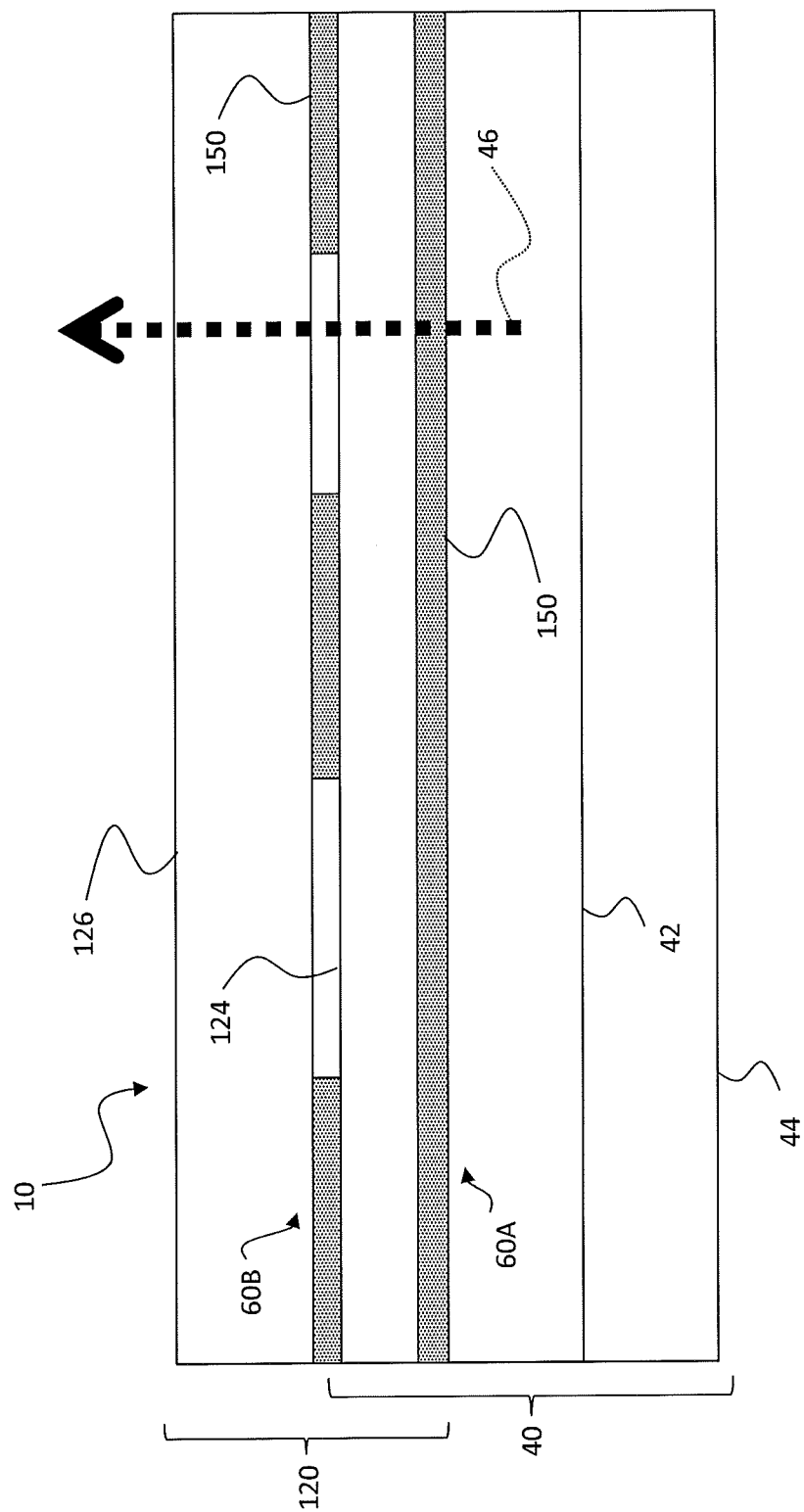
FIG. 7 is a cross section of a touch screen having two aligned layers of anisotropically conductive electrodes integrated with a display illustrating an embodiment of the present invention taken in the length direction of the lower substrate through a portion of a straight micro-wire.

In another useful embodiment illustrated in cross section FIG. 7, the transparent substrate 122 (e.g. transparent dielectric layer 124) is a cover or substrate of a display 40 through which light 46 is emitted or reflected by the display 40 and also the transparent dielectric layer 124 in the capacitive touch screen 120 to form the integrated touch-responsive capacitive device 10. A light-controlling layer 42 formed on or encapsulated by a substrate 44 controls the emission or reflection of light 46 (for example with OLED or liquid crystal materials). Transparent substrate 126 serves as a protective layer for the touch screen 120. First and second anisotropically conductive electrodes 60A, 60B including micro-wires 150 are located on either side of the transparent dielectric layer 124. Display devices having covers or substrates, for example OLED displays and liquid crystal displays are well known and can be used with the present invention as described.

Figure 10:
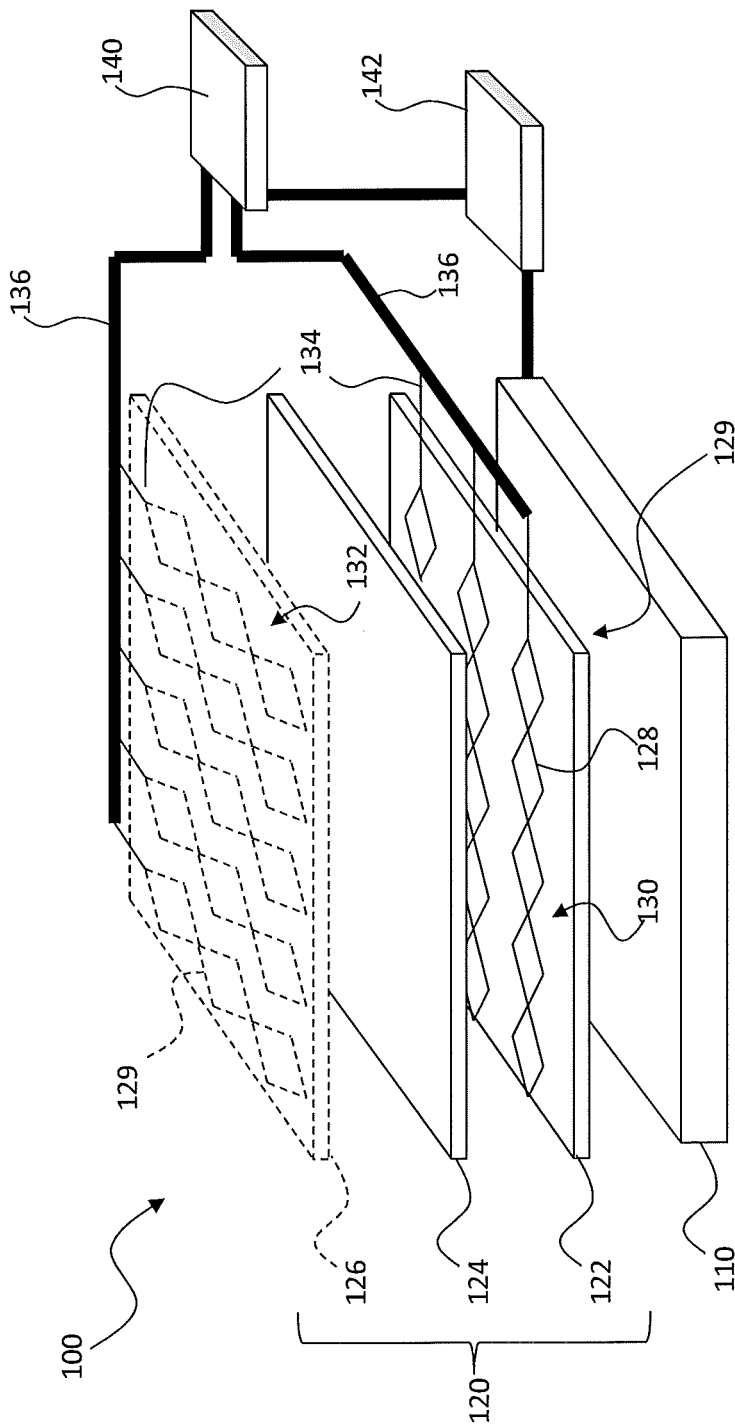
FIG. 10 is an exploded perspective illustrating a prior-art mutual capacitive touch screen having adjacent pad areas in conjunction with a display and controllers.
Figure 12:
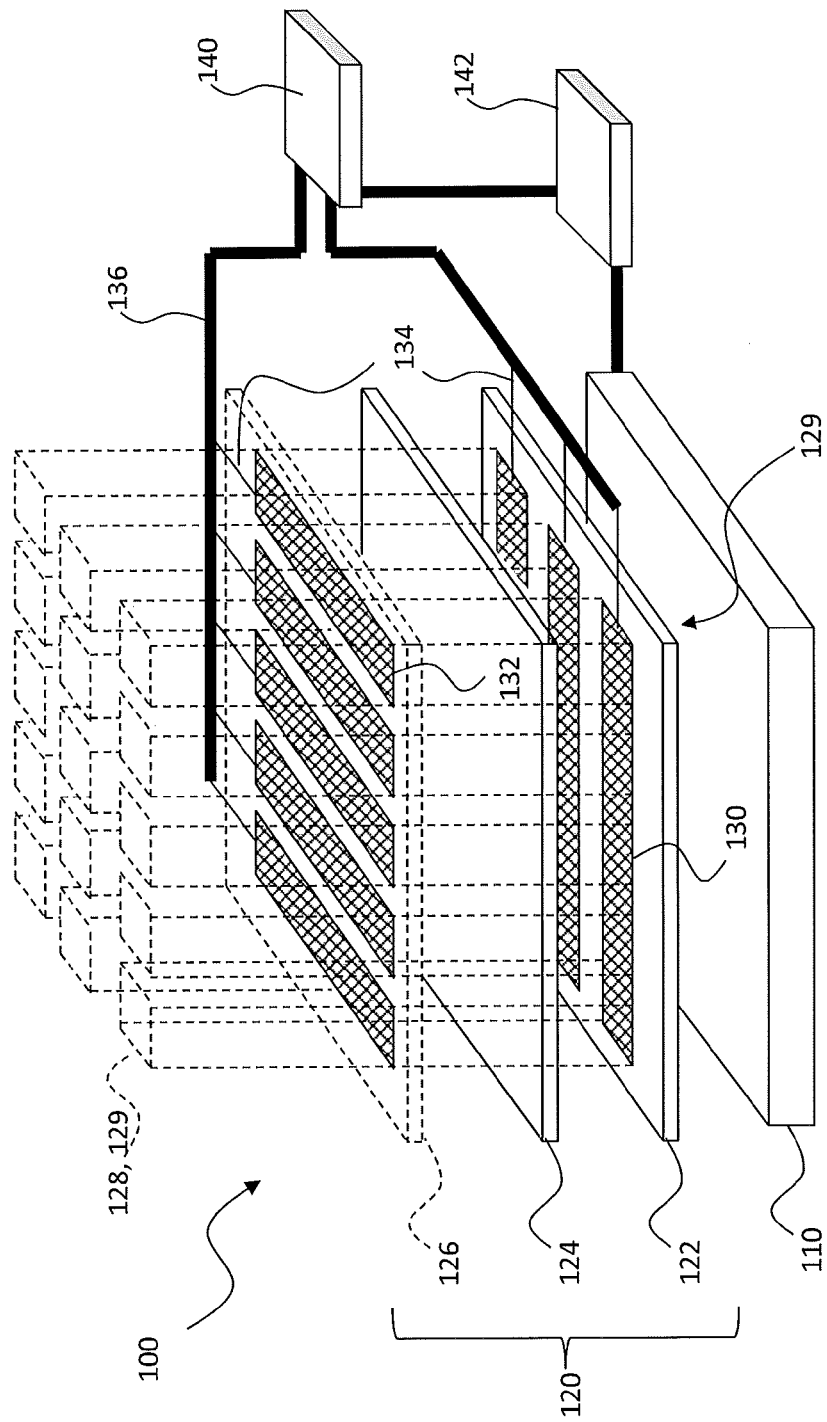
FIG. 12 is an exploded perspective illustrating a prior-art mutual capacitive touch screen having overlapping pad areas in conjunction with a display and controllers.

First and second anisotropically conductive electrodes 60A, 60B can be electrically connected to touch screen and display controllers 140, 142 and operated as discussed with reference to FIGS. 10 and 12.

Figure 15:
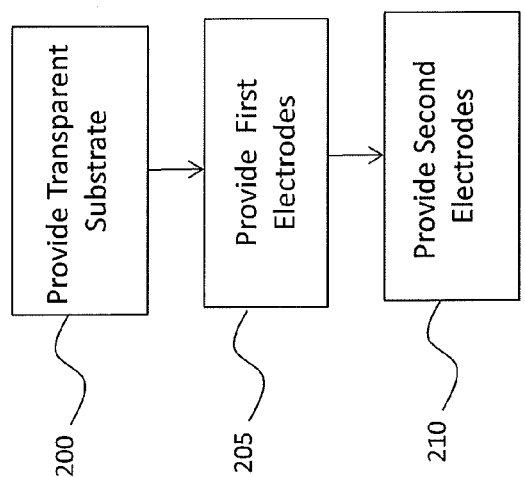

There are a variety of methods that can be employed to make an anisotropically conductive electrode, touch screen, or touch-screen device. Referring to FIG. 15, in one embodiment of the present invention, a method of making the touch-responsive capacitive device 10 includes providing 200 a transparent substrate 30 having a substantially planar first side and an opposing substantially parallel substantially planar second side, providing 205 a plurality of anisotropically conductive first electrodes 60A extending in a first length direction 61A over the transparent substrate 30, the first anisotropically conductive electrodes 60A each including a plurality of electrically connected micro-wires 150 formed in a first micro-pattern 56 over the first side of the transparent substrate 30; and providing 210 a plurality of anisotropically conductive second electrodes 60B extending in a second length direction orthogonal to the first length direction under the transparent substrate 30, the second anisotropically conductive electrodes 60B each including a plurality of electrically connected micro-wires 150 formed in a second micro-pattern 56 under the second side of the transparent substrate 30. The first and second micro-patterns 56 each have a plurality of substantially parallel straight micro-wires 151A extending substantially in the corresponding first and second length directions 61A, 61B and a plurality of angled micro-wires 152 formed at a non-orthogonal angle 57 to the straight micro-wires 151 electrically connecting the straight micro-wires 151 so that the anisotropically conductive first and second electrodes 60A, 60B have a greater electrical conductivity in the corresponding first and second length directions 61A, 61B than in another anisotropically conductive electrode direction.

In one embodiment of the method illustrated in FIG. 15, the transparent substrate is a dielectric layer having first and second sides. The first anisotropically conductive electrodes are formed on the first side and the second anisotropically conductive electrodes are formed on the second side. The dielectric layer can be provided as the cover or substrate of a display, for example a top-emitting display can employ the cover as the dielectric layer and a bottom-emitting display can employ the substrate as the dielectric layer.

Figure 16:
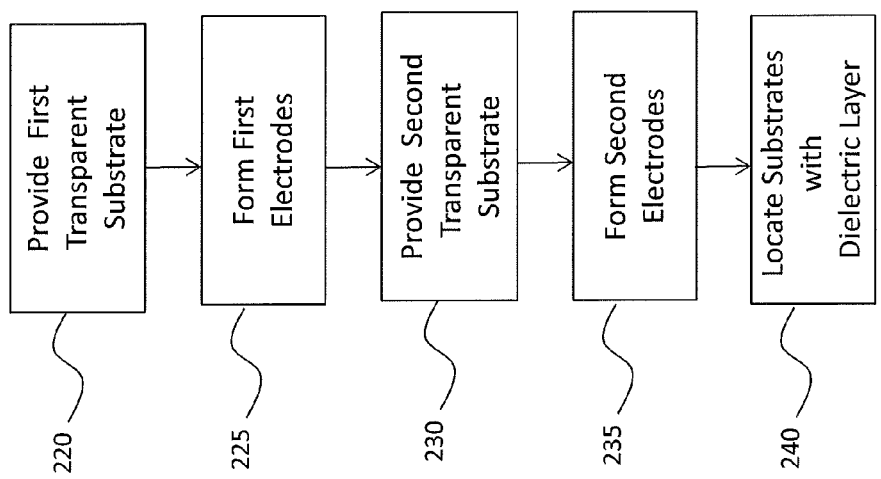
FIGS. 15-22 are flow charts illustrating various methods of the present invention.

In another embodiment illustrated in FIG. 16, a first transparent substrate 122 is provided in step 220 and the first anisotropically conductive electrodes 60A formed on a side of the first transparent substrate 122 in step 225. A second transparent substrate 126 is provided in step 230 and the second anisotropically conductive electrodes 60B formed on a side of the second transparent substrate 126 in step 235. The transparent substrates 122, 126 are then located or assembled step 240 together with the transparent dielectric layer 124 to form a touch screen 120. Preferably, the first and second anisotropically conductive electrodes 60A, 60B are located adjacent to the transparent dielectric layer 124. Either of the transparent substrates 122, 126 can be provided as the cover or substrate of a display 40 and assembled with the display 40.

Figure 17:
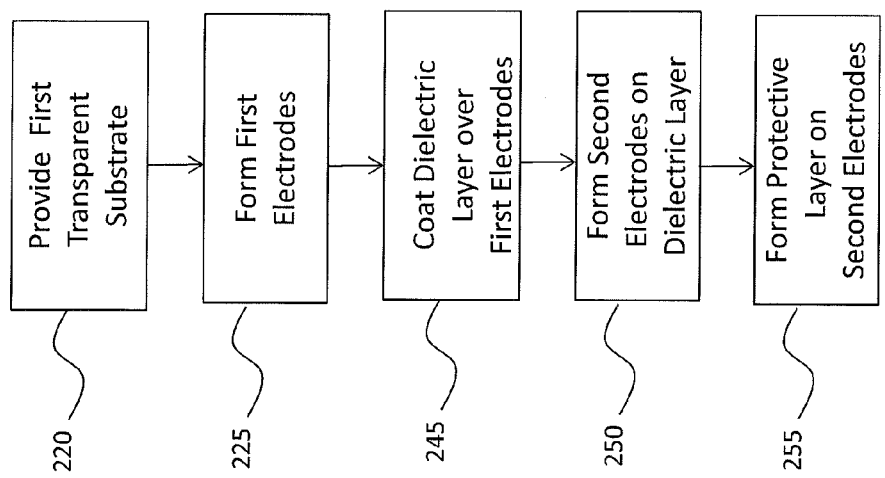

In yet another embodiment illustrated in FIG. 17, the first transparent substrate 122 is provided in step 220 and the first anisotropically conductive electrodes 60A formed on a side of the first transparent substrate 122 in step 225. The transparent dielectric layer 124 is coated or otherwise formed over the first anisotropically conductive electrodes 60A in step 245 and the second anisotropically conductive electrodes 60B formed on the transparent dielectric layer 124 in step 250. An optional protective layer can be formed or provided over the second anisotropically conductive electrodes 60B in step 255. The transparent substrates 122, 126 can be provided as the cover or substrate of the display 40. Similarly, the protective layer can be provided as the cover or substrate of a display and assembled with the display.

Where the touch screen 120 of the present invention is integrated with the display 40, a variety of methods can be employed. In a first method illustrated in FIG. 18, the touch screen 120 and display 40 are formed separately (steps 260, 265) and then combined in assembly step 270, for example aligning them and laminating them together with an adhesive matched to the refractive indices of the transparent substrate 122, 126 on which the display 40 or touch screen 120 are formed.

Figure 19:
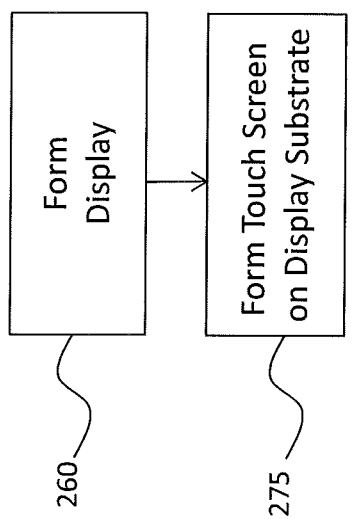

Alternatively, as illustrated in FIG. 19, the display 40 is formed (step 260) and the touch screen 120 is formed or assembled on a display substrate 44 in step 275 (for example the display cover or display substrate, depending on whether the display 40 is a top-emitting or bottom-emitting display).

Various steps of forming the touch screen 120 and the display 40 can be interleaved. For example, anisotropically conductive first electrodes 60A can be formed on a first side of the transparent substrate 30, the transparent substrate 30 provided as the cover or substrate of the display 40 with the first side oriented towards the display 40, and then the remainder of the touch screen 120 formed or assembled on a second side of the transparent substrate 30 opposite the first side.

Figure 18:
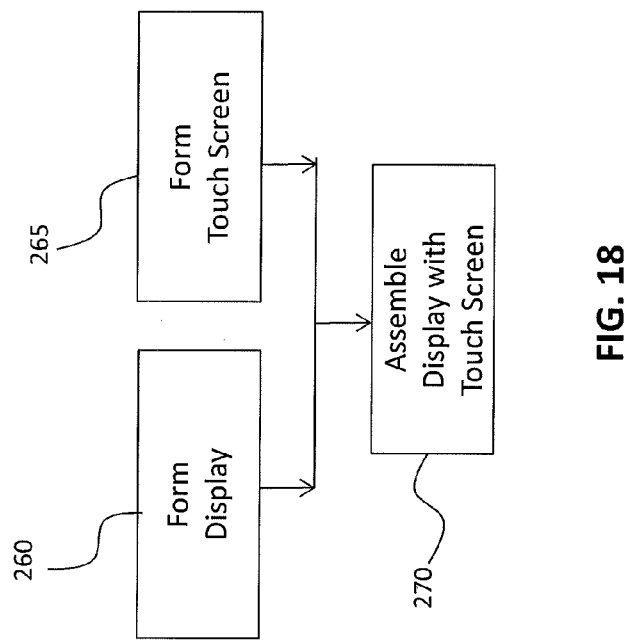
Figure 20:
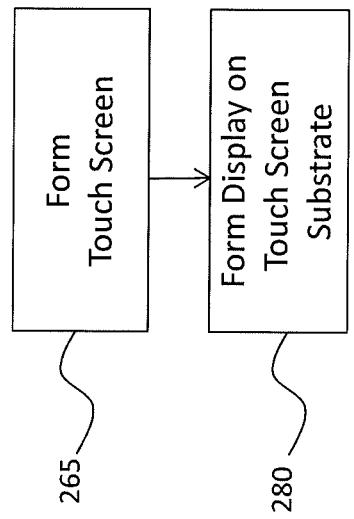
Figure 22:
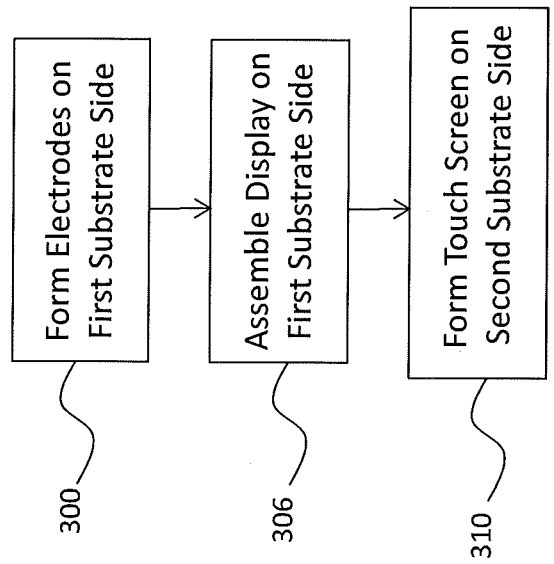
Figure 21:
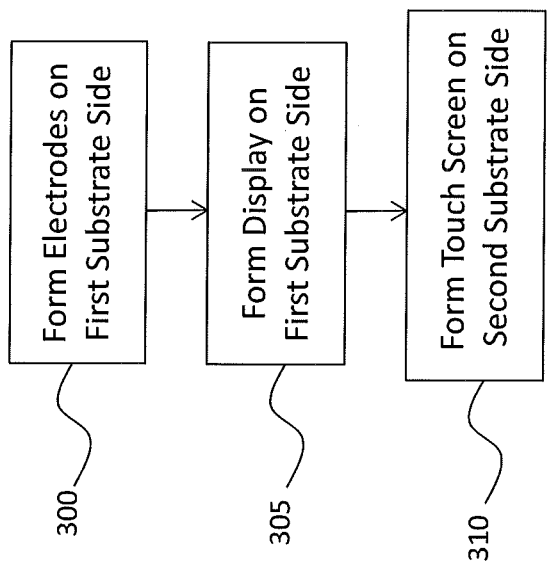

In another embodiment, as illustrated in FIG. 20, the touch screen 120 is formed (step 265) and the display 40 is formed or assembled on a touch screen substrate (e.g. 30, 122, 124, 126, or 44) in step 280. Since the touch screen 120 is formed on two sides of a substrate 30, if that substrate 30 is used as a cover or display substrate, the assembly or formation steps are interleaved. Referring to FIG. 21 in more detail, first anisotropically conductive electrodes 60A are first formed or provided on a first side of a substrate 30 in step 300. The display 40 is then formed over the anisotropically conductive electrodes 60 on the same first side in step 305. The remainder of the touch screen 120 (e.g. second anisotropically conductive electrodes 60B) is then formed on a second side of the substrate 30. In an alternative, referring to FIG. 22 in more detail, first anisotropically conductive electrodes 60A are first formed or provided on a first side of a substrate 30 in step 300. The display 40 whose elements are already formed or provided is then formed or assembled over the anisotropically conductive electrodes 60 on the same first side in step 306. The remainder of the touch screen 120 (e.g. second anisotropically conductive electrodes 60B) is then formed on a second side of the substrate 30 (step 310). The arrangement of FIG. 22 is particularly useful if the substrate 30 is the cover of the display 40, in which case the display 40 can be formed (except for the cover) separately from forming first anisotropically conductive electrodes 60A on the first substrate 30 (cover) side. The substrate 30 (cover) is then assembled into the display 40 with the first anisotropically conductive electrodes 60A located adjacent the display 40 and the touch screen 120 (e.g. second anisotropically conductive electrodes 60B) is then formed on a second side of the substrate 30. If the touch screen 120 is completely formed with the display cover as substrate before assembling the touch screen 120 into the display 40, the process of FIG. 18 is obtained, except that one fewer substrates is required.

The first and second transparent substrate 122, 126 can be similar substrates, for example made of similar materials and having similar material deposited and patterned thereon. Likewise, first and second anisotropically conductive electrodes 60A, 60B can be similar, for example made of similar materials using similar processes. Straight micro-wires 151 can include the same materials and have the same pattern and structure as angled micro-wires 152 for either or both of the anisotropically conductive electrodes 60, 60B.

Micro-wires 150 can be metal, for example silver, gold, aluminum, nickel, tungsten, titanium, tin, or copper or various metal alloys including, for example silver, gold, aluminum, nickel, tungsten, titanium, tin, or copper. Alternatively, the first or second micro-wires 150 can include cured or sintered metal particles such as nickel, tungsten, silver, gold, titanium, or tin or alloys such as nickel, tungsten, silver, gold, titanium, or tin. Conductive inks can be used to form micro-wires 150 with pattern-wise deposition and curing steps. Other materials or methods for forming micro-wires 150 can be employed and are included in the present invention.

As used herein, micro-wires 150 in each anisotropically conductive electrode 60 are micro-wires 150 formed in a micro-wire layer that forms a conductive mesh of electrically connected micro-wires 150. If the transparent substrate 122, 126 on which micro-wires 150 are formed is planar, for example, a rigid planar substrate such as a glass substrate, the micro-wires 150 in a micro-wire layer are formed in, or on, a common plane as a conductive, electrically connected mesh. If the transparent substrate 122, 126 is flexible and curved, for example a plastic substrate, the micro-wires 150 in a micro-wire layer are a conductive, electrically connected mesh that is a common distance from a surface of the flexible, transparent substrate 122, 126.

The micro-wires 150 can be formed on the transparent substrate 122, 126 or on a layer above (or beneath) the transparent substrate 122, 126. The micro-wires 150 for each of the anisotropically conductive first and second transparent electrodes 60A, 60B can be formed on opposing sides of the same transparent substrate 122, 126 (e.g. as shown in FIGS. 5A and 5B) or on facing sides of separate transparent substrates 122, 126 (e.g. as shown in FIGS. 4A and 4B) or some combination of those arrangements.

In an example and non-limiting embodiment of the present invention, each micro-wire 150 is 5 microns wide and separated from neighboring micro-wires 150 in the anisotropically conductive electrode 60 by a distance of 50 microns, so that the transparent electrode 122, 126 is 90% transparent. As used herein, transparent refers to elements that transmit at least 50% of incident visible light, preferably 80% or at least 90%. The micro-wires 150 can be arranged in the micro-pattern 56 that is unrelated to the pattern of the anisotropically conductive electrodes 60A, 60B. Micro-patterns 56 other than those illustrated in the Figures can be used in other embodiments and the present invention is not limited by the pattern of the anisotropically conductive first and second transparent electrodes 60A, 60B.

In embodiments of the present invention, the micro-wires 150 are made by depositing an unpatterned layer of material and then differentially exposing the layer to form the different micro-wire micro-patterns 56. For example, a layer of curable precursor material is coated over the substrate 30 and pattern-wise exposed. The first and second micro-patterns 56 are exposed in a common step or in different steps. A variety of processing methods can be used, for example photo-lithographic or silver halide methods. The materials can be differentially pattern-wise exposed and then processed.

A variety of materials can be employed to form the patterned micro-wires, including resins that can be cured by cross-linking wave-length-sensitive polymeric binders and silver halide materials that are exposed to light. Processing can include both washing out residual uncured materials and curing or exposure steps.

In an embodiment, a precursor layer includes conductive ink, conductive particles, or metal ink. The exposed portions of the precursor layer can be cured to form the micro-wires 150 (for example by exposure to patterned laser light to cross-link a curable resin) and the uncured portions removed. Alternatively, unexposed portions of the first and second micro-wire layers can be cured to form the micro-wires 150 and the cured portions removed.

In another embodiment of the present invention, the precursor layers are silver salt layers. The silver salt can be any material that is capable of providing a latent image (that is, a germ or nucleus of metal in each exposed grain of metal salt) according to a desired pattern upon photo-exposure. The latent image can then be developed into a metal image. For example, the silver salt can be a photosensitive silver salt such as a silver halide or mixture of silver halides. The silver halide can be, for example, silver chloride, silver bromide, silver chlorobromide, or silver bromoiodide.

According to some embodiments, the useful silver salt is a silver halide (AgX) that is sensitized to any suitable wavelength of exposing radiation. Organic sensitizing dyes can be used to sensitize the silver salt to visible or IR radiation, but it can be advantageous to sensitize the silver salt in the UV portion of the electromagnetic spectrum without using sensitizing dyes.

Processing of AgX materials to form conductive traces typically involves at least developing exposed AgX and fixing (removing) unexposed AgX. Other steps can be employed to enhance conductivity, such as thermal treatments, electroless plating, physical development and various conductivity enhancing baths as described in U.S. Pat. No. 3,223,525.

To achieve transparency, the total area occupied by the first micro-wires 150 can be less than 15% of the first transparent conductor area and the total area occupied by the second micro-wires 150 can be less than 15% of the second transparent conductor area. The transparent conductive structure can include a plurality of first and second transparent conductor areas.

In an embodiment, the first and second precursor material layers can each include a metallic particulate material or a metallic precursor material, and a photosensitive binder material.

In any of these cases, the precursor material is conductive after it is cured and any needed processing completed. Before patterning or before curing, the precursor material is not necessarily electrically conductive. As used herein, precursor material is material that is electrically conductive after any final processing is completed and the precursor material is not necessarily conductive at any other point in the micro-wire formation process.

Methods and device for forming and providing substrates, coating substrates, patterning coated substrates, or pattern-wise depositing materials on a substrate are known in the photo-lithographic arts. Likewise, tools for laying out electrodes, conductive traces, and connectors are known in the electronics industry as are methods for manufacturing such electronic system elements. Hardware controllers for controlling touch screens and displays and software for managing display and touch screen systems are all well known. All of these tools and methods can be usefully employed to design, implement, construct, and operate the present invention. Methods, tools, and devices for operating capacitive touch screens can be used with the present invention.

Although the present invention has been described with emphasis on capacitive touch screen embodiments, the anisotropically conductive transparent electrodes are useful in a wide variety of electronic devices. Such devices can include, for example, photovoltaic devices, OLED displays and lighting, LCD displays, plasma displays, inorganic LED displays and lighting, electrophoretic displays, electrowetting displays, dimming mirrors, smart windows, transparent radio antennae, transparent heaters and other touch screen devices such as resistive touch screen devices.

The invention has been described in detail with particular reference to certain embodiments thereof, but it will be understood that variations and modifications can be effected within the spirit and scope of the invention.

PARTS LIST

Ws straight micro-wire width
Wa angled micro-wire width
10 touch-responsive capacitive device
30 substrate
40 display
42 light-controlling layer
44 display substrate
46 light
56 micro-pattern
57 angle
60 anisotropically conductive electrode
60A first anisotropically conductive electrode
60B second anisotropically conductive electrode
61 length direction
61A first length direction
61B second length direction
62 anisotropically conductive electrode array
100 touch screen and display system
110 display
120 touch screen
122 first transparent substrate
124 transparent dielectric layer
124A first surface of dielectric layer
124B second surface dielectric layer
126 second transparent substrate
128 first pad area
129 second pad area
130 first transparent electrode
132 second transparent electrode
134 wires
136 buss connections
140 touch-screen controller
142 display controller
150 micro-wire
151 straight micro-wire
151A straight micro-wire
151B straight micro-wire
152 angled micro-wire
152A angled micro-wire
152B angled micro-wire
156 micro-pattern
158 pair of straight micro-wires
200 provide transparent substrate step
205 provide first electrodes step
210 provide second electrodes step
220 provide first transparent substrate step
225 form first electrodes step
230 provide second transparent substrate step
235 form second electrodes step
240 locate substrates with dielectric layer step
245 coat dielectric layer over first electrodes step
250 form second electrodes on dielectric layer step
255 form protective layer on second electrodes step
260 form display step
265 form touch screen step
270 assemble display with touch screen step
275 form touch screen on display substrate step
280 form display on touch screen substrate step
300 form electrodes on first substrate side step
305 form display on first substrate side step
306 assemble display on first substrate side step
310 form touch screen on second substrate side step

The invention claimed is:

1. A method of making a touch-responsive capacitive device, comprising:
   providing a transparent substrate having a substantially planar first side and an opposing substantially parallel substantially planar second side;
   providing a plurality of anisotropically conductive first electrodes extending in a first length direction over the transparent substrate, and including forming the anisotropically conductive first electrodes with a plurality of electrically connected micro-wires formed in a first micro-pattern over the first side of the transparent substrate; and
   providing a plurality of anisotropically conductive second electrodes extending in a second length direction orthogonal to the first length direction under the transparent substrate, and including forming the anisotropically conductive second electrodes with a plurality of electrically connected micro-wires formed in a second micro-pattern under the second side of the transparent substrate; and
   wherein the first and second micro-patterns each have a plurality of substantially parallel straight micro-wires extending substantially in the corresponding first and second length directions and a plurality of angled micro-wires formed at a non-orthogonal angle to the straight micro-wires electrically connecting the straight micro-wires so that the anisotropically conductive first and second electrodes have a greater electrical conductivity in the corresponding first and second length directions than in another anisotropically conductive electrode direction.

2. The method of claim 1, further including forming the anisotropically conductive first electrodes on the first side.

3. The method of claim 1, further including forming the anisotropically conductive second electrodes on the second side.

4. The method of claim 1, wherein the second micro-pattern is the same as the first micro-pattern, is a reflection or rotation of the first micro-pattern, or is spatially offset with respect to the first micro-pattern.

5. The method of claim 1, wherein the transparent substrate is a dielectric layer.

6. The method of claim 5, further including providing the anisotropically conductive first electrodes on a second substrate and forming the dielectric layer over the anisotropically conductive first electrodes.

7. The method of claim 6, further including forming the anisotropically conductive second electrodes over the dielectric layer.

8. The method of claim 1, further including providing a second transparent substrate and forming the second electrodes over the second transparent substrate.

9. The method of claim 8, wherein the second micro-pattern is the same as the micro-pattern, is a reflection or rotation of the micro-pattern, or is spatially offset with respect to the micro-pattern.

10. The method of claim 8, further including:
    providing a dielectric layer having first and second dielectric layer sides, the second dielectric layer side opposed and substantially parallel to the first dielectric layer side; and
    locating the dielectric layer between the first and second transparent substrates so that the anisotropically conductive first electrodes are adjacent to the first dielectric layer side and the anisotropically conductive second electrodes are adjacent to the second dielectric layer side.

11. The method of claim 10 further including forming the dielectric layer on or over the anisotropically conductive first electrodes or forming the dielectric layer on or over the anisotropically conductive second electrodes.

12. The method of claim 1, wherein the transparent substrate is the cover of a top-emitting display.

13. The method of claim 12, further including assembling the cover into a display device.

14. The method of claim 1, wherein the transparent substrate is the substrate of a bottom-emitting display.

15. The method of claim 14, further including forming anisotropically conductive first electrodes on the first side after forming the bottom-emitting display device on the second side.

16. The method of claim 14, further including forming anisotropically conductive first electrodes on the first side before forming the bottom-emitting display device on the second side.

\* \* \* \* \*